United States Patent
Jiang

(10) Patent No.: US 9,879,852 B2
(45) Date of Patent: Jan. 30, 2018

(54) LED TUBE LAMP

(71) Applicant: JIAXING SUPER LIGHTING ELECTRIC APPLIANCE CO., LTD, Zhejiang (CN)

(72) Inventor: Tao Jiang, Zhejiang (CN)

(73) Assignee: JIAXING SUPER LIGHTING ELECTRIC APPLIANCE CO., LTD, Zhejiang (CN)

( * ) Notice: Subject to any disclaimer, the term of this patent is extended or adjusted under 35 U.S.C. 154(b) by 0 days.

(21) Appl. No.: 15/087,088

(22) Filed: Mar. 31, 2016

(65) Prior Publication Data

US 2016/0215936 A1    Jul. 28, 2016

Related U.S. Application Data

(63) Continuation-in-part of application No. 14/865,387, filed on Sep. 25, 2015, now Pat. No. 9,609,711.

(30) Foreign Application Priority Data

Sep. 28, 2014  (CN) .......................... 2014 1 0507660
Sep. 28, 2014  (CN) .......................... 2014 1 0508899

(Continued)

(51) Int. Cl.
*H05B 37/00*  (2006.01)
*H05B 39/00*  (2006.01)
(Continued)

(52) U.S. Cl.
CPC .............. *F21V 29/83* (2015.01); *F21K 9/272* (2016.08); *F21V 29/508* (2015.01);
(Continued)

(58) Field of Classification Search
None
See application file for complete search history.

(56) References Cited

U.S. PATENT DOCUMENTS 2,454,049 A    11/1948  Floyd, Jr.
3,294,518 A    12/1966  Laseck et al.
(Continued)

FOREIGN PATENT DOCUMENTS

CN    200965185 Y    10/2007
CN    201014273 Y    1/2008
(Continued)

OTHER PUBLICATIONS

Notice of Allowance in related U.S. Appl. No. 15/056,121 dated May 31, 2016, 9 pages.
(Continued)

*Primary Examiner* — Anh Tran
(74) *Attorney, Agent, or Firm* — Andrew M. Calderon; Roberts Mlotkowski Safran Cole & Calderon, P.C.

(57) ABSTRACT

An LED tube lamp including a glass lamp tube, an LED light strip disposed inside the glass lamp tube, and an end cap attached over an end of glass lamp tube is disclosed. The glass lamp tube includes a main body region, a rear end region, and a two-arc-shaped transition region connecting the main body region and the rear end region. The LED light strip includes a bendable circuit sheet being longer than the glass lamp tube to form a freely extending end portion. In addition, the end cap has at least one opening on surface to dissipating heat resulting from power supply and/or the process of heating of a hot melt adhesive.

28 Claims, 20 Drawing Sheets

(30) Foreign Application Priority Data

| | | | |
|---|---|---|---|
| Nov. 6, 2014 | (CN) | ............... | 2014 1 0623355 |
| Dec. 5, 2014 | (CN) | ............... | 2014 1 0734425 |
| Feb. 12, 2015 | (CN) | ............... | 2015 1 0075925 |
| Mar. 11, 2015 | (CN) | ............... | 2015 1 0104823 |
| Mar. 25, 2015 | (CN) | ............... | 2015 1 0133689 |
| Mar. 26, 2015 | (CN) | ............... | 2015 1 0134586 |
| Mar. 27, 2015 | (CN) | ............... | 2015 1 0136796 |
| Apr. 3, 2015 | (CN) | ............... | 2015 1 0155807 |
| Apr. 15, 2015 | (CN) | ............... | 2015 1 0173861 |
| Apr. 22, 2015 | (CN) | ............... | 2015 1 0193980 |
| May 19, 2015 | (CN) | ............... | 2015 1 0259151 |
| May 22, 2015 | (CN) | ............... | 2015 1 0268927 |
| May 29, 2015 | (CN) | ............... | 2015 1 0284720 |
| Jun. 10, 2015 | (CN) | ............... | 2015 1 0315636 |
| Jun. 17, 2015 | (CN) | ............... | 2015 1 0338027 |
| Jun. 26, 2015 | (CN) | ............... | 2015 1 0364735 |
| Jun. 26, 2015 | (CN) | ............... | 2015 1 0372375 |
| Jun. 26, 2015 | (CN) | ............... | 2015 1 0373492 |
| Jun. 29, 2015 | (CN) | ............... | 2015 1 0378322 |
| Jul. 2, 2015 | (CN) | ............... | 2015 1 0391910 |
| Jul. 10, 2015 | (CN) | ............... | 2015 1 0406595 |
| Jul. 20, 2015 | (CN) | ............... | 2015 1 0428680 |
| Aug. 7, 2015 | (CN) | ............... | 2015 1 0482944 |
| Aug. 8, 2015 | (CN) | ............... | 2015 1 0483475 |
| Aug. 8, 2015 | (CN) | ............... | 2015 1 0486115 |
| Sep. 2, 2015 | (CN) | ............... | 2015 1 0555543 |
| Sep. 6, 2015 | (CN) | ............... | 2015 1 0557717 |
| Sep. 18, 2015 | (CN) | ............... | 2015 1 0595173 |

(51) Int. Cl.

| | |
|---|---|
| *F21V 29/83* | (2015.01) |
| *H05B 33/08* | (2006.01) |
| *F21V 29/508* | (2015.01) |
| *F21K 9/272* | (2016.01) |
| *F21V 17/10* | (2006.01) |
| *F21V 23/02* | (2006.01) |
| *F21V 3/02* | (2006.01) |
| *F21Y 103/10* | (2016.01) |
| *F21Y 115/10* | (2016.01) |
| *F21K 9/66* | (2016.01) |
| *H05K 1/11* | (2006.01) |
| *H05K 1/18* | (2006.01) |

(52) U.S. Cl.
CPC ............ H05B 33/0809 (2013.01); *F21K 9/66* (2016.08); *F21V 3/02* (2013.01); *F21V 17/101* (2013.01); *F21V 23/02* (2013.01); *F21V 23/023* (2013.01); *F21Y 2103/10* (2016.08); *F21Y 2115/10* (2016.08); *H05K 1/118* (2013.01); *H05K 1/189* (2013.01); *H05K 2201/10106* (2013.01)

(56) References Cited

U.S. PATENT DOCUMENTS

| | | | |
|---|---|---|---|
| 4,156,265 A | 5/1979 | Rose | |
| 4,647,399 A | 3/1987 | Peters et al. | |
| 5,575,459 A | 11/1996 | Anderson | |
| 5,921,660 A | 7/1999 | Yu | |
| 6,118,072 A | 9/2000 | Scott | |
| 6,127,783 A | 10/2000 | Pashley | |
| 6,211,262 B1 | 4/2001 | Mejiritski et al. | |
| 6,609,813 B1 | 8/2003 | Showers | |
| 6,796,680 B1 | 9/2004 | Showers | |
| 6,860,628 B2 | 3/2005 | Robertson | |
| 6,936,855 B1 | 8/2005 | Harrah et al. | |
| 7,033,239 B2 | 4/2006 | Cunkelman | |
| 7,067,032 B1 | 6/2006 | Bremont et al. | |
| 7,594,738 B1 | 9/2009 | Lin et al. | |
| 7,611,260 B1* | 11/2009 | Lin | F21K 9/00 362/217.01 |
| 8,360,599 B2 | 1/2013 | Ivey | |
| 8,456,075 B2 | 6/2013 | Axelsson | |
| 8,579,463 B2 | 11/2013 | Clough | |
| D761,216 S | 7/2016 | Jiang | |
| 9,447,929 B2 | 9/2016 | Jiang | |
| D768,891 S | 10/2016 | Jiang et al. | |
| 2002/0044456 A1 | 4/2002 | Balestriero | |
| 2002/0176262 A1 | 11/2002 | Tripathi | |
| 2003/0102819 A1 | 6/2003 | Min | |
| 2003/0189829 A1 | 10/2003 | Shimizu | |
| 2003/0231485 A1 | 12/2003 | Chien | |
| 2004/0095078 A1 | 5/2004 | Leong | |
| 2004/0189218 A1 | 9/2004 | Leong | |
| 2005/0128751 A1 | 6/2005 | Roberge | |
| 2005/0162850 A1 | 7/2005 | Luk et al. | |
| 2005/0168123 A1 | 8/2005 | Taniwa | |
| 2005/0185396 A1 | 8/2005 | Kutler | |
| 2005/0207166 A1 | 9/2005 | Kan | |
| 2005/0213321 A1 | 9/2005 | Lin | |
| 2006/0028837 A1 | 2/2006 | Mrakovich et al. | |
| 2007/0001709 A1 | 1/2007 | Shen | |
| 2007/0145915 A1 | 6/2007 | Roberge | |
| 2007/0210687 A1 | 9/2007 | Axelsson | |
| 2007/0274084 A1 | 11/2007 | Kan | |
| 2008/0030981 A1 | 2/2008 | Mrakovich | |
| 2008/0192476 A1 | 8/2008 | Hiratsuka | |
| 2008/0278941 A1 | 11/2008 | Logan | |
| 2008/0290814 A1* | 11/2008 | Leong | F21K 9/00 315/294 |
| 2009/0140271 A1 | 6/2009 | Sah | |
| 2009/0159919 A1* | 6/2009 | Simon | F21K 9/175 257/99 |
| 2009/0161359 A1 | 6/2009 | Siemiet | |
| 2009/0290334 A1 | 11/2009 | Ivey | |
| 2010/0085772 A1 | 4/2010 | Song et al. | |
| 2010/0177532 A1 | 7/2010 | Simon et al. | |
| 2010/0201269 A1 | 8/2010 | Tzou | |
| 2010/0253226 A1* | 10/2010 | Oki | F21V 3/00 315/113 |
| 2010/0277918 A1 | 11/2010 | Chen | |
| 2011/0038146 A1* | 2/2011 | Chen | F21V 19/001 362/225 |
| 2011/0057572 A1 | 3/2011 | Kit et al. | |
| 2011/0084627 A1* | 4/2011 | Sloan | F21V 15/013 315/297 |
| 2011/0090684 A1 | 4/2011 | Logan | |
| 2011/0148313 A1 | 6/2011 | Antonius | |
| 2011/0216538 A1 | 9/2011 | Logan | |
| 2012/0049684 A1 | 3/2012 | Bodenstein et al. | |
| 2012/0069556 A1 | 3/2012 | Bertram | |
| 2012/0106157 A1 | 5/2012 | Simon | |
| 2012/0146503 A1 | 6/2012 | Negley et al. | |
| 2012/0153873 A1 | 6/2012 | Hayashi et al. | |
| 2012/0169968 A1 | 7/2012 | Ishimori et al. | |
| 2012/0235578 A1 | 9/2012 | Miller | |
| 2012/0293991 A1 | 11/2012 | Lin | |
| 2012/0319150 A1 | 12/2012 | Shimomura et al. | |
| 2013/0021809 A1 | 1/2013 | Dellian et al. | |
| 2013/0033881 A1 | 2/2013 | Terazawa et al. | |
| 2013/0033888 A1 | 2/2013 | Wel et al. | |
| 2013/0050998 A1 | 2/2013 | Chu et al. | |
| 2013/0069538 A1 | 3/2013 | So | |
| 2013/0094200 A1 | 4/2013 | Dellian et al. | |
| 2013/0135852 A1* | 5/2013 | Chan | F21V 21/002 362/218 |
| 2013/0170196 A1 | 7/2013 | Huang et al. | |
| 2013/0170245 A1 | 7/2013 | Hong et al. | |
| 2013/0182425 A1 | 7/2013 | Seki | |
| 2013/0200797 A1 | 8/2013 | Timmermans | |
| 2013/0250565 A1 | 9/2013 | Chiang et al. | |
| 2013/0256704 A1 | 10/2013 | Hsiao et al. | |
| 2013/0258650 A1 | 10/2013 | Sharrah | |
| 2013/0313983 A1 | 11/2013 | Radermacher | |

(56) References Cited

U.S. PATENT DOCUMENTS

| | | | |
|---|---|---|---|
| 2014/0009923 A1* | 1/2014 | Wu | F21K 9/27 362/218 |
| 2014/0071667 A1 | 3/2014 | Hayashi et al. | |
| 2014/0153231 A1 | 6/2014 | Bittmann | |
| 2014/0225519 A1 | 8/2014 | Yu | |
| 2014/0226320 A1 | 8/2014 | Halliwell | |
| 2015/0009688 A1 | 1/2015 | Timmermans et al. | |
| 2015/0176770 A1 | 6/2015 | Wilcox | |
| 2015/0327368 A1 | 11/2015 | Su | |
| 2016/0081147 A1* | 3/2016 | Guang | H05B 33/0803 315/123 |
| 2016/0091147 A1 | 3/2016 | Jiang et al. | |
| 2016/0091156 A1 | 3/2016 | Li et al. | |
| 2016/0091179 A1 | 3/2016 | Jiang et al. | |
| 2016/0102813 A1 | 4/2016 | Ye et al. | |
| 2016/0178135 A1 | 6/2016 | Xu et al. | |
| 2016/0178137 A1 | 6/2016 | Jiang | |
| 2016/0178138 A1 | 6/2016 | Jiang | |
| 2016/0198535 A1 | 7/2016 | Ye et al. | |
| 2016/0212809 A1 | 7/2016 | Xiong et al. | |
| 2016/0215936 A1 | 7/2016 | Jiang | |
| 2016/0215937 A1 | 7/2016 | Jiang | |
| 2016/0219658 A1 | 7/2016 | Xiong et al. | |
| 2016/0219666 A1 | 7/2016 | Xiong et al. | |
| 2016/0219672 A1 | 7/2016 | Liu | |
| 2016/0223180 A1 | 8/2016 | Jiang | |
| 2016/0223182 A1 | 8/2016 | Jiang | |
| 2016/0229621 A1 | 8/2016 | Jiang et al. | |
| 2016/0255694 A1 | 9/2016 | Jiang et al. | |
| 2016/0255699 A1 | 9/2016 | Ye et al. | |
| 2016/0270163 A1 | 9/2016 | Hu et al. | |
| 2016/0270164 A1 | 9/2016 | Xiong et al. | |
| 2016/0270165 A1 | 9/2016 | Xiong et al. | |
| 2016/0270166 A1 | 9/2016 | Xiong et al. | |
| 2016/0270173 A1 | 9/2016 | Xiong | |
| 2016/0270184 A1 | 9/2016 | Xiong et al. | |
| 2016/0290566 A1 | 10/2016 | Jiang et al. | |
| 2016/0290567 A1 | 10/2016 | Jiang et al. | |
| 2016/0290568 A1 | 10/2016 | Jiang et al. | |
| 2016/0290569 A1 | 10/2016 | Jiang et al. | |
| 2016/0290570 A1 | 10/2016 | Jiang et al. | |
| 2016/0290598 A1 | 10/2016 | Jiang | |
| 2016/0290609 A1 | 10/2016 | Jiang et al. | |
| 2016/0295706 A1 | 10/2016 | Jiang | |
| 2016/0309550 A1 | 10/2016 | Xiong et al. | |
| 2016/0323948 A1 | 11/2016 | Xiong et al. | |
| 2016/0341414 A1 | 11/2016 | Jiang | |
| 2016/0356472 A1 | 12/2016 | Liu et al. | |
| 2016/0363267 A1 | 12/2016 | Jiang et al. | |
| 2016/0381746 A1 | 12/2016 | Ye et al. | |
| 2016/0381760 A1 | 12/2016 | Xiong et al. | |
| 2017/0001793 A1 | 1/2017 | Jiang et al. | |
| 2017/0038012 A1 | 2/2017 | Jiang et al. | |
| 2017/0038013 A1 | 2/2017 | Liu et al. | |
| 2017/0038014 A1 | 2/2017 | Jiang et al. | |
| 2017/0089521 A1 | 3/2017 | Jiang | |
| 2017/0089530 A1 | 3/2017 | Jiang | |
| 2017/0130911 A1 | 5/2017 | Li et al. | |
| 2017/0159894 A1 | 6/2017 | Jiang | |
| 2017/0167664 A1 | 6/2017 | Li et al. | |

FOREIGN PATENT DOCUMENTS

| | | |
|---|---|---|
| CN | 201363601 | 12/2009 |
| CN | 201437921 | 4/2010 |
| CN | 101715265 A | 5/2010 |
| CN | 102052652 | 5/2011 |
| CN | 102116460 | 7/2011 |
| CN | 102121578 | 7/2011 |
| CN | 102155642 A | 8/2011 |
| CN | 202125774 U | 1/2012 |
| CN | 102355780 A | 2/2012 |
| CN | 202216003 | 5/2012 |
| CN | 102518972 A | 6/2012 |
| CN | 202302841 | 7/2012 |
| CN | 102720901 | 10/2012 |
| CN | 102777788 | 11/2012 |
| CN | 102889446 | 1/2013 |
| CN | 102932997 A | 2/2013 |
| CN | 202791824 U | 3/2013 |
| CN | 203068187 | 7/2013 |
| CN | 203240337 U | 10/2013 |
| CN | 203240337 U | 10/2013 |
| CN | 203363984 | 12/2013 |
| CN | 203384716 U | 1/2014 |
| CN | 203413396 U | 1/2014 |
| CN | 203453866 U | 2/2014 |
| CN | 203464014 | 3/2014 |
| CN | 103742875 | 4/2014 |
| CN | 203549435 | 4/2014 |
| CN | 203585876 U | 5/2014 |
| CN | 203615157 | 5/2014 |
| CN | 103851547 | 6/2014 |
| CN | 203771102 | 8/2014 |
| CN | 104033772 | 9/2014 |
| CN | 203927469 | 11/2014 |
| CN | 203963553 U | 11/2014 |
| CN | 204042527 | 12/2014 |
| CN | 204201535 U | 3/2015 |
| CN | 204268162 | 4/2015 |
| CN | 204300737 U | 4/2015 |
| CN | 104595765 A | 5/2015 |
| CN | 204420636 | 6/2015 |
| CN | 204420636 U | 6/2015 |
| CN | 104776332 | 7/2015 |
| CN | 104832813 A | 8/2015 |
| CN | 204573639 | 8/2015 |
| EP | 3146803 | 3/2017 |
| GB | 2519258 | 4/2015 |
| GB | 2523275 | 8/2015 |
| GB | 2531425 | 4/2016 |
| JP | 2008117666 | 5/2008 |
| JP | 2011061056 | 3/2011 |
| JP | 2014154479 | 8/2014 |
| KR | 20120000551 | 1/2012 |
| KR | 1020120055349 | 5/2012 |
| WO | WO 2011/132120 A1 | 10/2011 |
| WO | 2012129301 | 9/2012 |
| WO | WO 2013/125803 A1 | 8/2013 |
| WO | WO 2014/001475 A1 | 1/2014 |
| WO | 2014117435 | 8/2014 |
| WO | 2014118754 | 8/2014 |
| WO | WO 2015/036478 A1 | 3/2015 |
| WO | 2015081809 | 6/2015 |
| WO | 2016086901 | 6/2016 |

OTHER PUBLICATIONS

PCT Search Report for International Application No. PCT/CN2015/090859 dated Jan. 4, 2016.

PCT Search Report for International Application No. PCT/CN2015/090814 dated Dec. 30, 2015.

* cited by examiner

LED TUBE LAMP

CROSS-REFERENCE TO RELATED APPLICATIONS

This application is a continuation-in-part (CIP) of U.S. patent application Ser. No. 14/865,387, filed on Sep. 25, 2015, which claims priority to Chinese Patent Applications No. CN 201410507660.9 filed on Sep. 28, 2014; CN 201410508899.8 filed on Sep. 28, 2014; CN 201410623355.6 filed on Nov. 6, 2014; CN 201410734425.5 filed on Dec. 5, 2014; CN 201510075925.7 filed on Feb. 23, 2015; CN201510104823.3 filed on Mar. 11, 2015; CN 201510134586.5 filed on 2015/3/26; CN201510133689.x filed on Mar. 25, 2015; CN 201510136796.8 filed on Mar. 27, 2015; CN201510173861.4 filed on Apr. 15, 2015; CN201510155807.7 filed on Apr. 3, 2015; CN201510193980.6 filed on Apr. 22, 2015; CN 201510372375.5 filed on Jun. 26, 2015; CN 201510259151.3 filed on May 19, 2015; CN201510268927.8 filed on May 22, 2015; CN201510284720.x filed on May 29, 2015; CN 201510338027.6 filed on Jun. 17, 2015; CN 201510315636.x filed on Jun. 10, 2015; CN 201510373492.3 filed on Jun. 26, 2015; CN201510364735.7 filed on Jun. 26, 2015; CN201510378322.4 filed on Jun. 29, 2015; CN201510391910.1 filed on Jul. 2, 2015; CN201510406595.5 filed on Jul. 10, 2015; CN 201510482944.1 filed on Aug. 7, 2015; CN201510486115.0 filed on Aug. 8, 2015; CN201510428680.1 filed on Jul. 20, 2015; CN 201510483475.5 filed on Aug. 8, 2015; CN 201510555543.4 filed on Sep. 2, 2015, CN201510557717.1 filed on Sep. 6, 2015; and CN201510595173.7 filed on Sep. 18, 2015 the disclosures of which are incorporated herein in their entirety by reference.

FIELD OF THE INVENTION

The present disclosure relates to illumination devices, and more particularly to an LED tube lamp and its components including the light sources, electronic components, and end caps.

BACKGROUND OF THE INVENTION

LED lighting technology is rapidly developing to replace traditional incandescent and fluorescent lightings. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitting to the light sources through the circuit board. However, existing LED tube lamps have certain drawbacks.

First, the typical circuit board is rigid and allows the entire lamp tube to maintain a line tube configuration when the lamp tube is partially ruptured or broken, and this gives the user a false impression that the LED tube lamp remains usable and is likely to cause the user to be electrically shocked upon handling or installation of the LED tube lamp.

Second, the rigid circuit board is typically electrically connected with the end caps by way of wire bonding, in which the wires may be easily damaged and even broken due to any move during manufacturing, transportation, and usage of the LED tube lamp and therefore may disable the LED tube lamp.

Third, the lamp tube and the end caps are often secured together by using adhesive, and it is hard to prevent the buildup of excess (overflown) adhesive residues. This may cause light blockage as well as an unpleasant aesthetic appearance. In addition, a large amount of manpower is required to clean off the excessive adhesive buildup, create a further production bottleneck and inefficiency. Also, bad heat dissipation of the power supply components inside the end caps can cause a high temperature and therefore reduces life span of the adhesive and simultaneously disables the adhesion between the lamp tube and the end caps, which may decrease the reliability of the LED tube lamp.

Fourth, the existing LED tube lamps are bad in heat dissipation, especially have problem in dissipating heat resulting from the power supply components inside the end caps and the process of heating of a hot melt adhesive. The heat resulting from the power supply components and the process of heating of a hot melt adhesive may cause a high temperature around end cap and therefore reduces life span of the adhesive and simultaneously disables the adhesion between the lamp tube and the end caps.

Accordingly, the present disclosure and its embodiments are herein provided.

SUMMARY OF THE INVENTION

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and are described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof.

The present invention provides a novel LED tube lamp, and aspects thereof.

The present invention provides an LED tube lamp. According to one embodiment, the LED tube lamp includes a glass lamp tube, an end cap, a power supply, and an LED light strip. The glass lamp tube extending in a first direction along a length of the glass lamp tube includes a main body region, a rear end region, and a two-arc-shaped transition region connecting the main body region and the rear end region, the main body region and the rear end region are substantially parallel. The end cap is disposed at one end of the glass lamp tube and includes an electrically insulating tubular part, a socket for connection with a power supply, at least one opening on surface, and a magnetic metal member. The electrically insulating tubular part is sleeved with the end of the glass lamp tube. The electrically insulating tubular part has an inner circumferential surface with a plurality of protruding portions formed thereon and extending inwardly in a radial direction of the electrically insulating tubular part. The at least one opening is for dissipating heat resulting from the power supply and/or the process of heating of a hot melt adhesive. The magnetic metal member is fixedly disposed between the protruding portions of the inner circumferential surface of the electrically insulating tubular part of the end cap and the end of the glass lamp tube. Each of the protruding portions is disposed between an outer circumferential surface of the magnetic metal member and the inner circumferential surface of the electrically insulating tubular part thereby forming a space therebetween with a hot melt adhesive contained in the space. The glass lamp tube and the end cap are secured by the hot melt adhesive. The power supply is provided inside the end cap and has a metal pin at one end, while the end cap has a hollow conductive pin to accommodate the metal pin of the power supply. The LED light strip is disposed inside the glass lamp tube with a plurality of LED light sources mounted on the LED light strip. The LED light strip has a bendable circuit sheet electrically connect the LED light sources and the power supply. The length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube. The freely extending end portion is electrically connected to the power supply.

In some embodiments, the at least one opening may be located on an end surface of the electrically insulating tubular part.

In some embodiments, the at least one opening may be adjacent to an edge of the end surface of the electrically insulating tubular part.

In some embodiments, the at least one opening comprises openings arranged to form a circle or a partial circle.

In some embodiments, the at least one opening comprises openings arranged to form concentric circles or concentric partial circles.

In some embodiments, the at least one opening may be in a shape of arc, line or partial circle, such that the efficiency of heat dissipation of the LED tube lamp could be improved.

In some embodiments, at least one opening is located on an end surface of the electrically insulating tubular part, and at least one opening is located on an outer circumferential surface of the electrically insulating tubular part.

The present invention also provides an LED tube lamp, according to one embodiment, including a glass lamp tube, two end caps, a power supply, and an LED light strip disposed inside the glass lamp tube. The glass lamp tube extending in a first direction along a length of the glass lamp tube includes a main body region, a rear end region, and a two-arc-shaped transition region connecting the main body region and the rear end region, the main body region and the rear end region are substantially parallel. The two end caps with different sizes are respectively disposed at two ends of the glass lamp tube. At least one of the two end caps includes an electrically insulating tubular part, at least one opening on surface, and a magnetic metal member. The electrically insulating tubular part is sleeved with the end of the lamp tube. The electrically insulating tubular part has an inner circumferential surface with a plurality of protruding portions formed thereon and extending inwardly in a radial direction of the electrically insulating tubular part. The at least one opening is for dissipating heat resulting from the power supply and/or the process of heating of a hot melt adhesive. The magnetic metal member is fixedly disposed between the protruding portions of the inner circumferential surface of the electrically insulating tubular part of the end cap and the end of the lamp tube. Each of the protruding portions is disposed between an outer circumferential surface of the magnetic metal member and the inner circumferential surface of the electrically insulating tubular part thereby forming a space therebetween with a hot melt adhesive contained in the space. The glass lamp tube and the end cap are secured by the hot melt adhesive. The power supply is provided inside one of the end caps and has a metal pin at one end, while the end cap has a hollow conductive pin to accommodate the metal pin of the power supply. The LED light strip is disposed inside the glass lamp tube with a plurality of LED light sources mounted on the LED light strip. The LED light strip has a bendable circuit sheet electrically connect the LED light sources and the power supply. The length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube. The freely extending end portion is electrically connected to the power supply.

In some embodiments, the size of one end cap is 30%-80% of the size of the other end cap.

The present invention provides another LED tube lamp, according to one embodiment, including a glass lamp tube, an end cap, a power supply, and an LED light strip. The glass lamp tube extending in a first direction along a length of the glass lamp tube includes a main body region, a rear end region, and a two-arc-shaped transition region connecting the main body region and the rear end region, the main body region and the rear end region are substantially parallel. The end cap is disposed at one end of the glass lamp tube. The end cap includes at least one opening in a shape of arc on surface to dissipate heat resulting from the power supply and/or the process of heating of a hot melt adhesive, such that the efficiency of heat dissipation of the LED tube lamp could be improved. The glass lamp tube and the end cap are secured by a hot melt adhesive. The power supply is provided inside the end cap and has a metal pin at one end, while the end cap has a hollow conductive pin to accommodate the metal pin of the power supply. The LED light strip is disposed inside the glass lamp tube with a plurality of LED light sources mounted on the LED light strip. The LED light strip has a bendable circuit sheet electrically connecting the LED light sources and the power supply. The length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube. The freely extending end portion is electrically connected to the power supply.

The present invention provides another LED tube lamp, according to one embodiment, including a glass lamp tube extending in a first direction along a length of the glass lamp tube comprising a main body region, a rear end region, and two transition regions connecting the main body region and the rear end region, the main body region and the rear end region are substantially parallel; and two end caps disposed at one end of the glass lamp tube; wherein the end cap comprises at least one opening to dissipate heat, and glass lamp tube and the end cap are secured by a hot melt adhesive, and a power supply is provided inside the end cap.

In the above-mentioned embodiments, the at least one opening is in a shape of arc on surface.

In the above-mentioned embodiments, the LED light strip has a bendable circuit sheet to electrically connect the LED light sources with the power supply, and the length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube, and the freely extending end portion is electrically connected to the power supply.

In the above-mentioned embodiments, the glass lamp tube includes the main body region, the rear end region, and the two-arc-shaped transition region connecting the main body region and the rear end region. Therefore, a height difference between the rear end region and the main body region is formed to avoid adhesives applied on the rear end region being overflowed onto the main body region, and thereby saves manpower for removing the overflowed adhesive and increases productivity. Since the glass lamp tube includes the two-arc-shaped transition region, the bendable circuit sheet is necessary such that it can be mounted on the inner surface of the glass lamp tube as well as extending into the end cap to be connected to the power supply.

By applying electromagnetic field to the magnetic metal member, an electrical current will be induced in the magnetic metal member, which makes the magnetic metal member be heated. The heated magnetic metal member heats the hot melt adhesive to make the hot melt adhesive expansive and flowing and then solidified after cooling, and the bonding for the end cap and the lamp tube can be accomplished. In addition, the hot melt adhesive may be used to electrically insulate the glass lamp tube and the end caps to further prevent from any possible electrical shock when the glass lamp tube is broken.

The at least one opening on the surface of the end cap may help to dissipate heat resulting from the power supply and the process of heating of a hot melt adhesive by passing through the end cap, such that the reliability of the LED tube lamp could be improved. While in some embodiments, the openings disposed on the surface of the end cap may not pass through the end cap for heat dissipation.

DETAILED DESCRIPTION OF PREFERRED EMBODIMENTS

The present disclosure provides a novel LED tube lamp based on the glass made lamp tube to solve the abovementioned problems. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

"Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0% to 5% deviation around 0.1 and a 0% to 5% deviation around 1, especially if such deviation maintains the same effect as the listed range."

"Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein."

Figure 1:
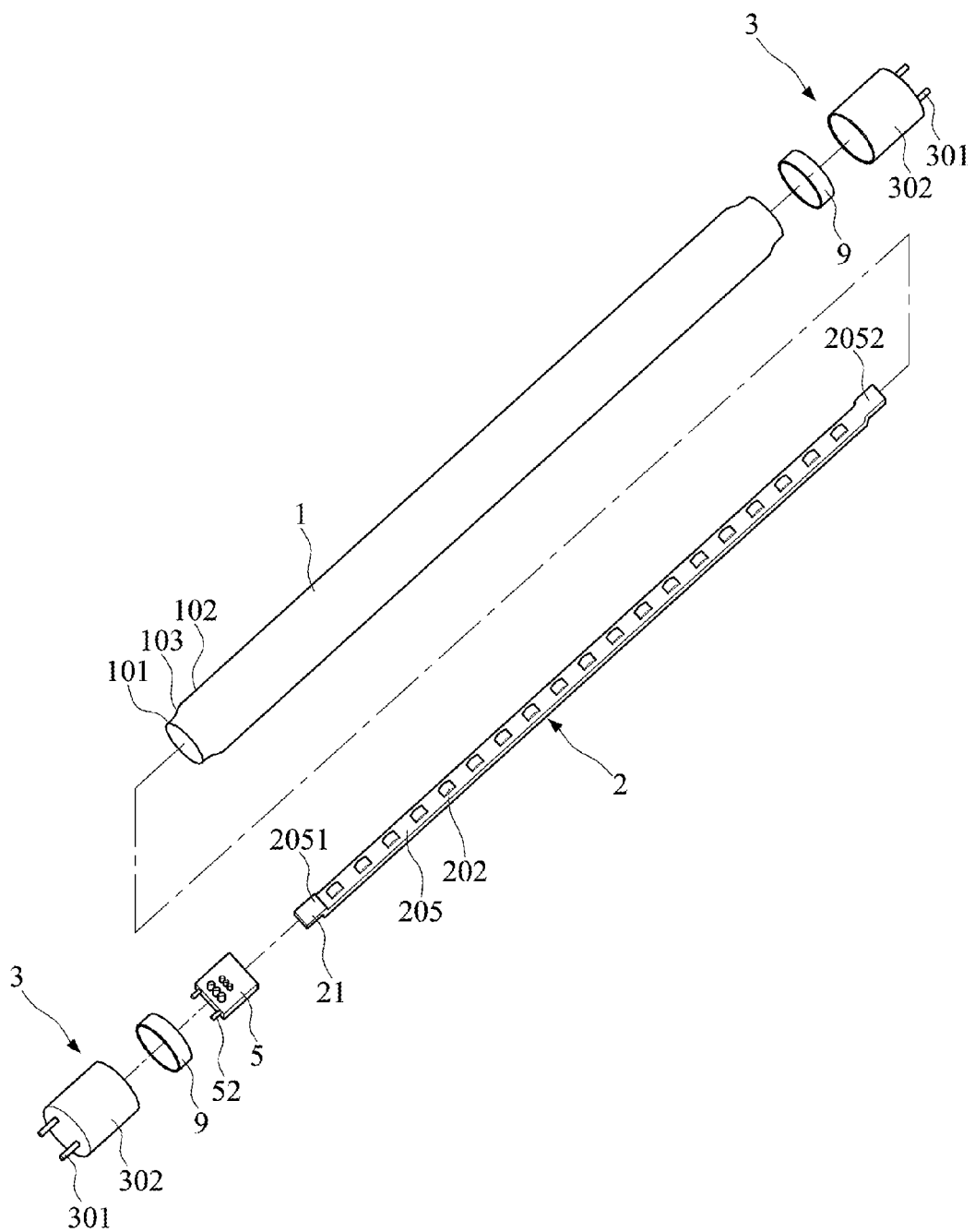
FIG. 1 is an exploded view schematically illustrating the LED tube lamp according to the first embodiment of the present invention.
Figure 2:
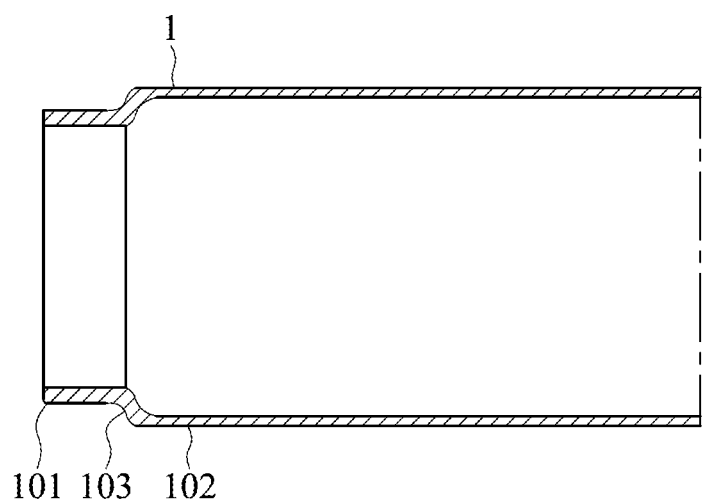
FIG. 2 is a plane cross-sectional view schematically illustrating end structure of a glass lamp tube of the LED tube lamp according to one embodiment of the present invention.

Referring to FIG. 1 and FIG. 2, an LED tube lamp in accordance with a first embodiment of the present invention includes a glass lamp tube 1, two end caps 3 respectively disposed at two ends of the glass lamp tube 1, a power supply 5, and an LED light strip 2 disposed inside the glass lamp tube 1. The glass lamp tube 1 extending in a first direction along a length of the glass lamp tube 1 includes a main body region 102, a rear end region 101, and a two-arc-shaped transition region 103 connecting the main body region and the rear end region 101, the main body region 102 and the rear end region 101 are substantially parallel. The outer diameter of the rear end region 101 is smaller than that of the main body region 102, therefore, a height difference between the rear end region 101 and the main body region 102 is formed to avoid adhesives applied on the rear end region 101 being overflowed onto the main body region 102, and thereby saves manpower for removing the overflowed adhesive and increases productivity.

Figure 3:
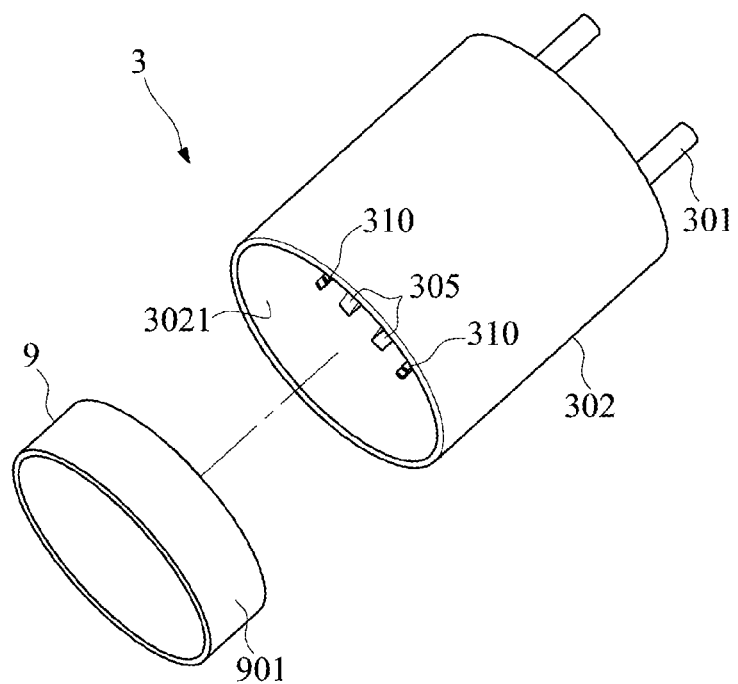
FIG. 3 is a perspective view schematically illustrating the end cap according to one embodiment of the present invention.
Figure 4:
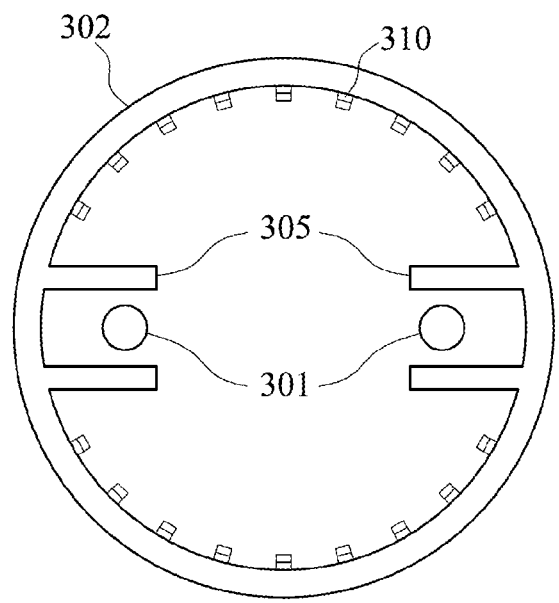
FIG. 4 is a side view schematically illustrating the end cap according to one embodiment of the present invention.

Referring to FIG. 1, FIG. 3 and FIG. 4, the end cap 3 is disposed at one end of the glass lamp tube 1 and includes an electrically insulating tubular part 302, a socket 305 for connection with a power supply 5, and a magnetic metal member 9. The electrically insulating tubular part 302 is sleeved with the one end of the glass lamp tube 1. The electrically insulating tubular part 302 has an inner circumferential surface with a plurality of protruding portions 310 formed thereon and extending inwardly in a radial direction of the electrically insulating tubular part 302. In one embodiment, the electrically insulating tubular part 302 is not limited to being made of plastic or ceramic, any material that is not a good electrical conductor can be used.

Figure 5:
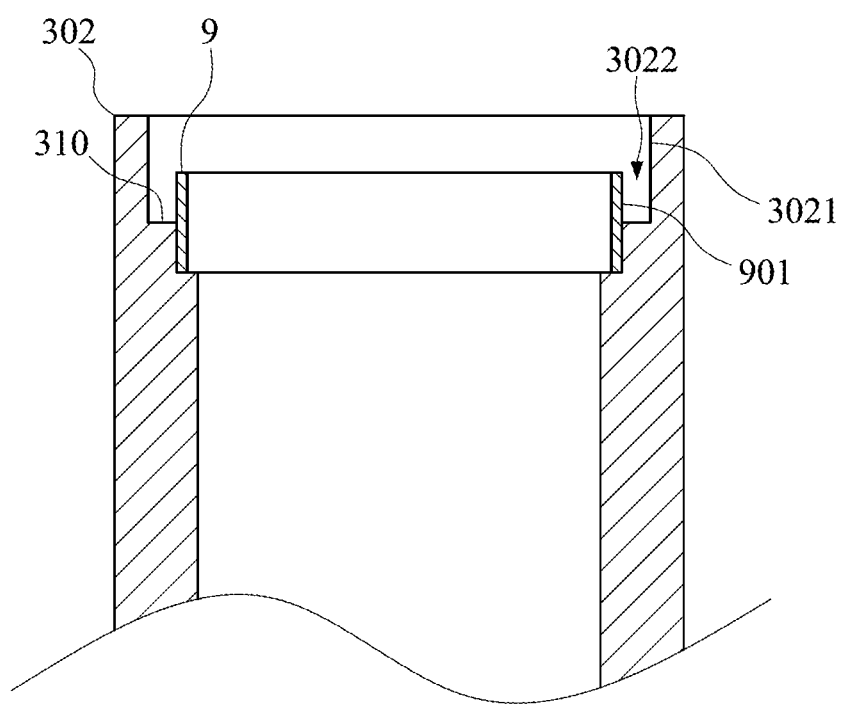
FIG. 5 is a plane cross-sectional view schematically illustrating partial end cap according to one embodiment of the present invention.

Referring to FIG. 1, FIG. 3 and FIG. 4, the magnetic metal member 9 can be a metal ring that is tubular in shape and is fixedly disposed between the protruding portions 310 of the inner circumferential surface of the electrically insulating tubular part 302 and the end of the glass lamp tube 1. Referring to FIG. 3 to FIG. 5, each of the protruding portions 310 is disposed between an outer circumferential surface 901 of the magnetic metal member 9 and the inner circumferential surface 3021 of the electrically insulating tubular part 302 thereby forming a space 3022 therebetween with a hot melt adhesive contained in the space 3022 for securing the end caps 3 with the glass lamp tube 1.

Referring to FIG. 1 and FIG. 4, the power supply 5 is provided inside the end cap 3 and can be fixed in the socket 305. The power supply 5 has a metal pin 52 at one end, while the end cap 3 has a hollow conductive pin 301 to accommodate the metal pin 52 of the power supply 5.

Figure 6:
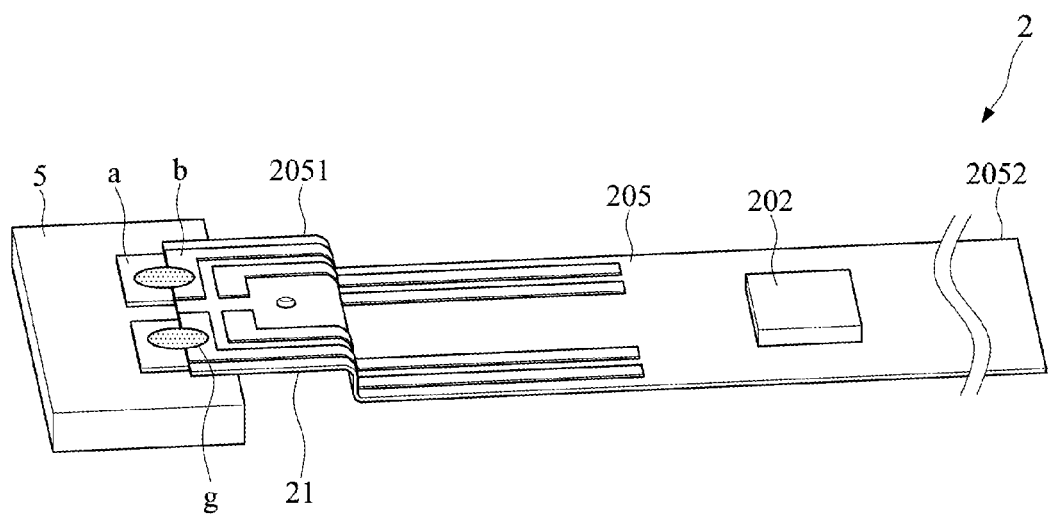
FIG. 6 is a perspective view schematically illustrating the soldering pad of the bendable circuit sheet of the LED light strip for soldering connection with the printed circuit board of the power supply of the LED tube lamp according to one embodiment of the present invention.

Referring to FIG. 1 and FIG. 6, the LED light strip 2 is disposed inside the glass lamp tube 1 with a plurality of LED light sources 202 mounted on the LED light strip 2. The LED light strip 2 has a bendable circuit sheet 205 electrically connect the LED light sources 202 with the power supply 5. The length of the bendable circuit sheet 205 is larger than the length of the glass lamp tube 1, and the bendable circuit sheet 205 has a first end 2051 and a second end 2052 opposite to each other along the first direction, and at least the first end 2051 of the bendable circuit sheet 205 is bent away from the glass lamp tube 1 to form a freely extending end portion 21 along a longitudinal direction of the glass lamp tube 1. In some embodiments, if two power supplies 5 are adopted, then the second end 2052 might be bent away from the glass lamp tube 1 to form another freely extending end portion 21 along the longitudinal direction of the glass lamp tube 1. The freely extending end portion 21 is electrically connected to the power supply 5. Specifically, the power supply 5 has soldering pads "a" which are capable of being soldered with the soldering pads "b" of the freely extending end portion 21 by soldering material "g".

Figure 7:
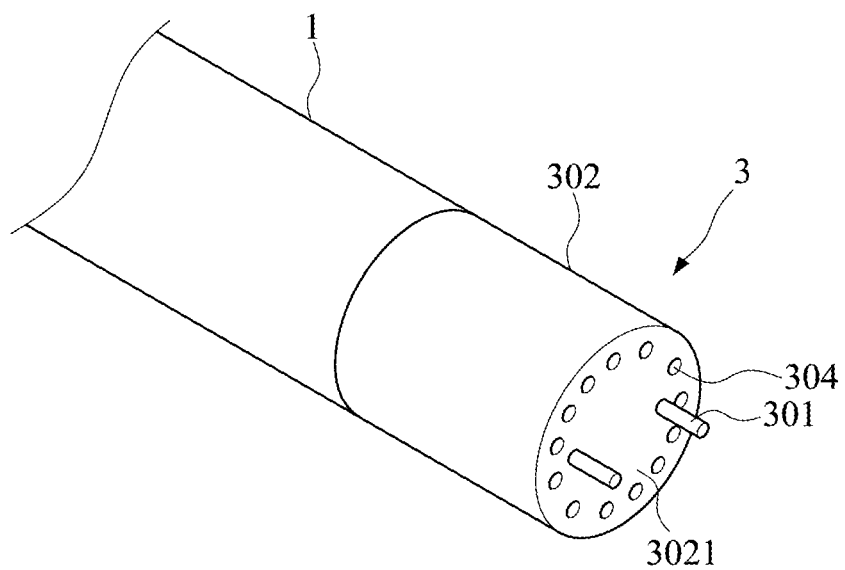
FIG. 7 is a perspective view schematically illustrating the openings of end cap of the LED tube lamp according to the first embodiment of the present invention which are arranged to form a circle.
Figure 8:
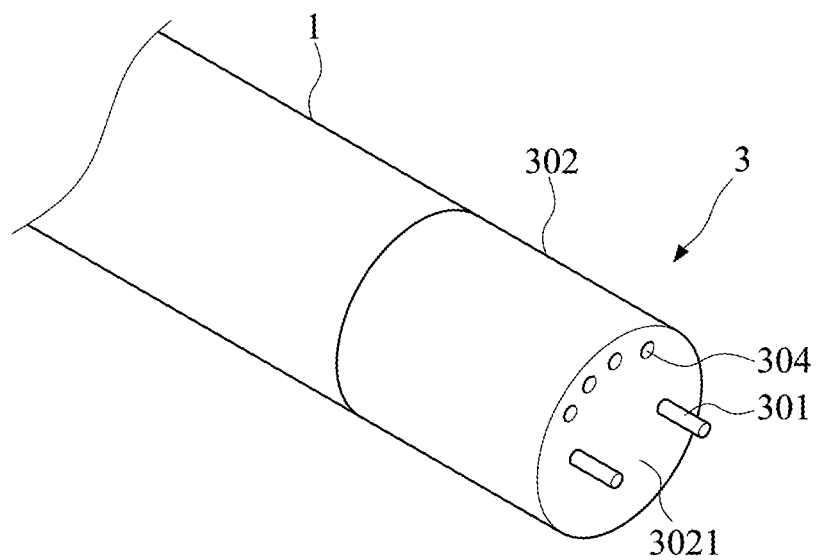
FIG. 8 is a perspective view schematically illustrating the openings of end cap of the LED tube lamp according to the first embodiment of the present invention which are arranged to form a partial circle.
Figure 9:
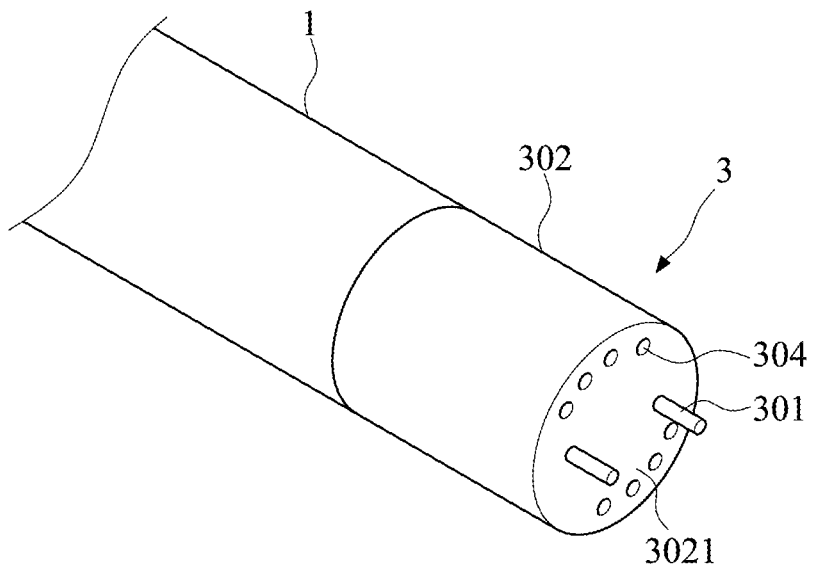
FIG. 9 is a perspective view schematically illustrating the openings of end cap of the LED tube lamp according to the first embodiment of the present invention which are arranged to form two partial circles.
Figure 10:
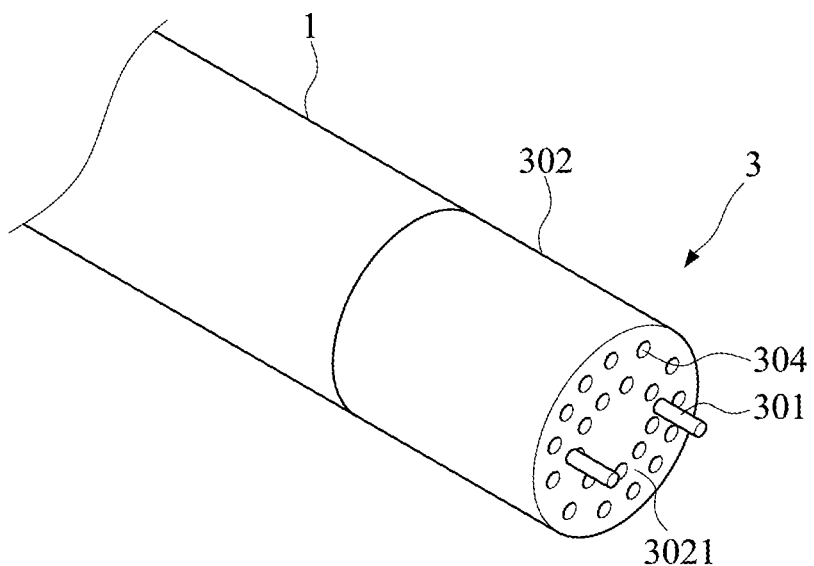
FIG. 10 is a perspective view schematically illustrating the openings of end cap of the LED tube lamp according to the first embodiment of the present invention which are arranged to form a concentric circle.
Figure 11:
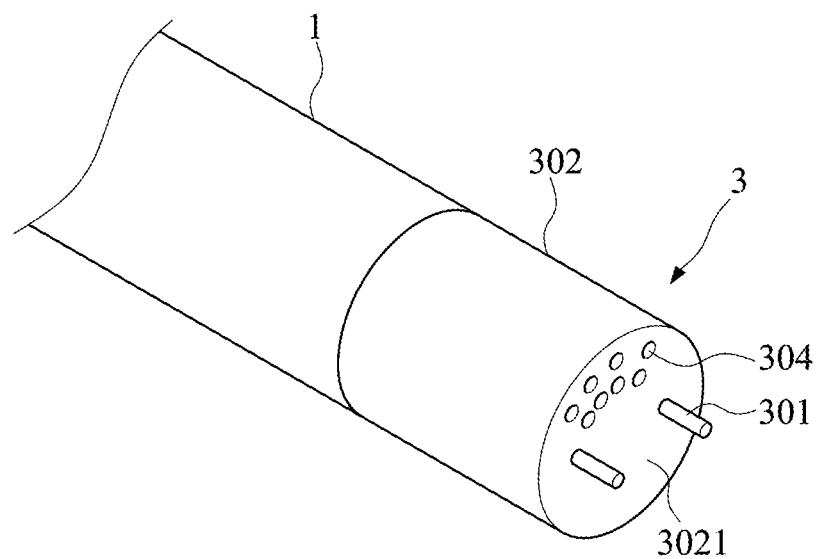
FIG. 11 is a perspective view schematically illustrating the openings of end cap of the LED tube lamp according to the first embodiment of the present invention which are arranged to form concentric partial circles.
Figure 12:
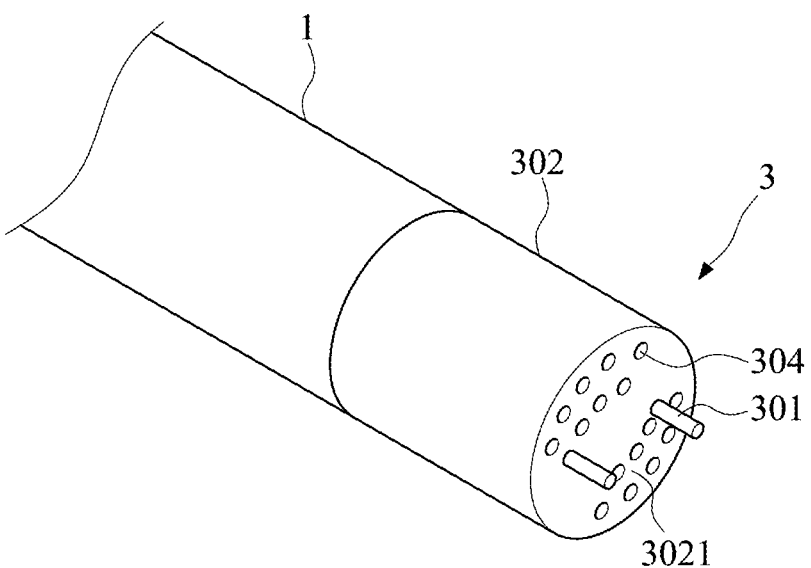
FIG. 12 is a perspective view schematically illustrating the openings of end cap of the LED tube lamp according to the first embodiment of the present invention which are arranged to form concentric partial circles.

Referring to FIG. 7 to FIG. 13, in order to dissipate heat resulting from the power supply 5 and the process of heating of a hot melt adhesive, the end cap 3 has openings 304. In some embodiments, the openings 304 may be located on end surface 3021 of the electrically insulating tubular part 302. In some embodiments, the openings 304 may be adjacent to an edge of the end surface 3021 of the electrically insulating tubular part 302. In some embodiments, the openings 304 may be arranged to form a circle as shown in FIG. 7, or a partial circle as shown in FIG. 8 and FIG. 9. In some embodiments, the openings 304 may be arranged to form concentric circles as shown in FIG. 10, or concentric partial circles as shown in FIG. 11 and FIG. 12.

Figure 13:
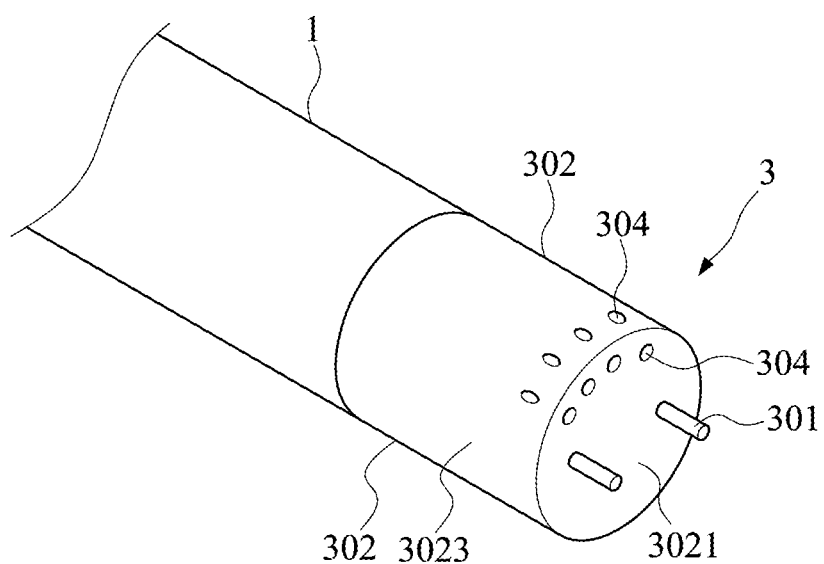
FIG. 13 is a perspective view schematically illustrating at least one opening of the LED tube lamp according to the first embodiment of the present invention is located on an end surface of the electrically insulating tubular part, and at least one opening is located on an outer circumferential surface of the electrically insulating tubular part.

Referring to FIG. 13, in some embodiments, at least one of the openings 304 is located on an end surface 3021 of the electrically insulating tubular part 302, and at least one of the openings 304 is located on an outer circumferential surface 3023 of the electrically insulating tubular part 302.

Figure 14:
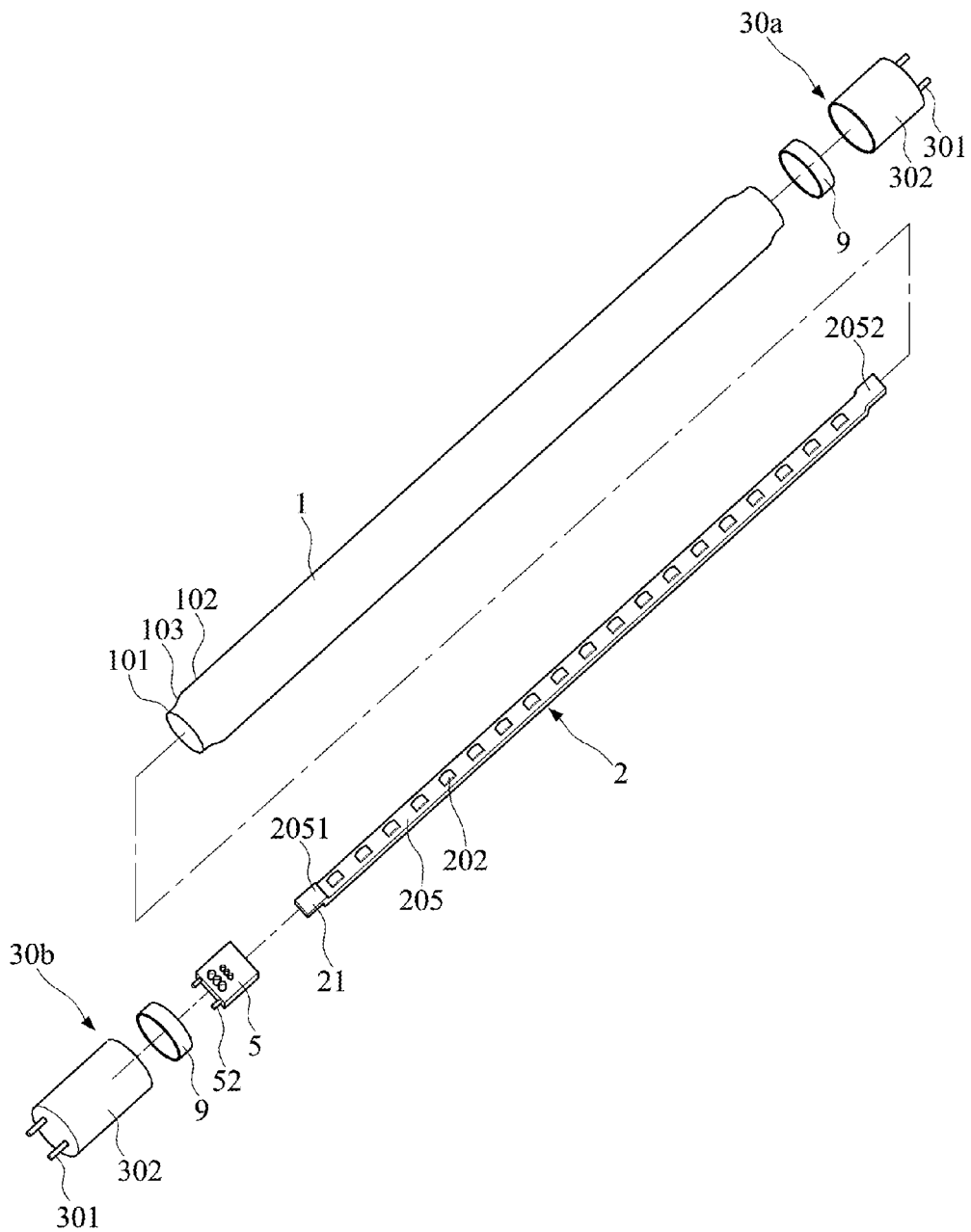
FIG. 14 is an exploded view schematically illustrating the LED tube lamp according to the second embodiment of the present invention.

Referring to FIG. 2 and FIG. 14, an LED tube lamp in accordance with a second embodiment of the present invention includes a glass lamp tube 1, end cap 30a and end cap 30b, a power supply 5, and an LED light strip 2 disposed inside the glass lamp tube 1.

The glass lamp tube 1 extending in a first direction along a length of the glass lamp tube 1 includes a main body region 102, a rear end region 101, and a two-arc-shaped transition region 103 connecting the main body region 102 and the rear end region 101, the main body region 102 and the rear end region 101 are substantially parallel. The outer diameter of the rear end region 101 is smaller than that of the main body region 102, therefore, a height difference between the rear end region 101 and the main body region 102 is formed to avoid adhesives applied on the rear end region 101 being overflowed onto the main body region 102, and thereby saves manpower for removing the overflowed adhesive and increases productivity.

Referring to FIG. 3, FIG. 4, and FIG. 14, the end caps 30a and 30b are different in size, in which the end cap 30a is smaller than the end cap 30b. The end caps 30a and 30b are respectively disposed at two ends of the glass lamp tube 1. At least one of the two end caps 30a and 30b (for example the larger one, end cap 30b) includes an electrically insulating tubular part 302, a socket 305 for connection with a power supply 5, and a magnetic metal member 9. The electrically insulating tubular part 302 is sleeved with the end of the glass lamp tube 1. The electrically insulating tubular part 302 has an inner circumferential surface with a plurality of protruding portions 310 formed thereon and extending inwardly in a radial direction of the electrically insulating tubular part 302. In one embodiment, the electrically insulating tubular part 302 is not limited to being made of plastic or ceramic, any material that is not a good electrical conductor can be used.

Referring to FIG. 3, FIG. 4, and FIG. 14, the magnetic metal member 9 can be a metal ring that is tubular in shape and is fixedly disposed between the protruding portions 310 of the inner circumferential surface of the electrically insulating tubular part 302 and the end of the lamp tube 1. Referring to FIG. 3 to FIG. 5, Each of the protruding portions 310 is disposed between an outer circumferential surface 901 of the magnetic metal member 9 and the inner circumferential surface 3021 of the electrically insulating tubular part 302 thereby forming a space 3022 therebetween with a hot melt adhesive contained in the space 3022 for securing the end caps 30a and 30b with the glass lamp tube 1.

Referring to FIG. 4 and FIG. 14, the power supply 5 is provided inside the larger end cap 30b and has two metal pins 52 at one end, while the end cap 3 has two hollow conductive pins 301 to accommodate the metal pins 52 of the power supply 5. In some embodiments, even though only one power supply 5 is needed, the smaller end cap 30a may also have two dummy hollow conductive pins 301 for the purpose of fixing and installation.

Referring to FIG. 6 and FIG. 14, the LED light strip 2 is disposed inside the glass lamp tube 1 with a plurality of LED light sources 202 mounted on the LED light strip 2. The LED light strip 2 has a bendable circuit sheet 205 electrically connect the LED light sources 202 with the power supply 5. The length of the bendable circuit sheet 205 is larger than the length of the glass lamp tube 1 and the bendable circuit sheet 205 has a first end 2051 and a second end 2052 opposite to each other along the first direction, and at least the first end 2051 of the bendable circuit sheet 205 is bent away from the glass lamp tube 1 to form a freely extending end portion 21 along a longitudinal direction of the glass lamp tube 1. In some embodiments, if two power supplies 5 are adopted, then the second end 2052 might be bent away from the glass lamp tube 1 to form another freely extending end portion 21 along the longitudinal direction of the glass lamp tube 1. The freely extending end portion 21 is electrically connected to the power supply 5. Specifically, the power supply 5 has soldering pads "a" which are capable of being soldered with the soldering pads "b" of the freely extending end portion 21 by soldering material "g".

Figure 15:
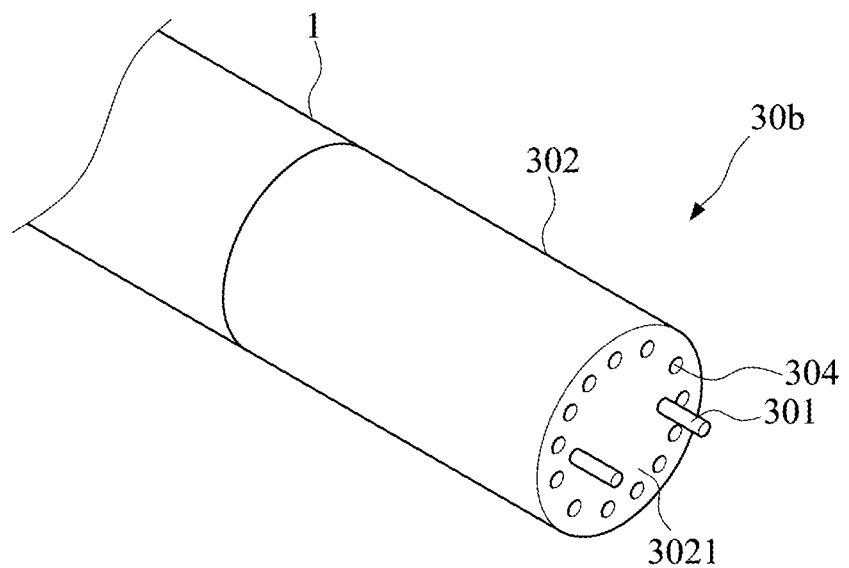
FIG. 15 is a perspective view schematically illustrating the openings of end cap of the LED tube lamp according to the second embodiment of the present invention which are arranged to form a circle.
Figure 16:
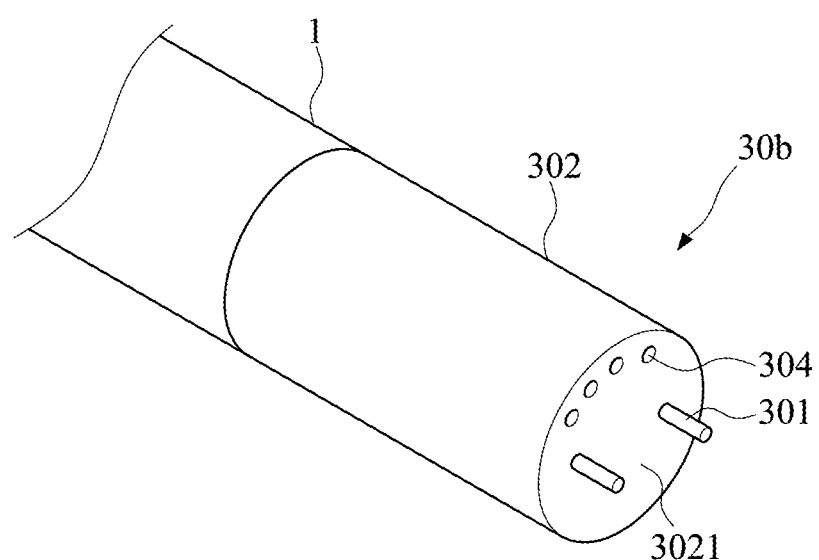
FIG. 16 is a perspective view schematically illustrating the openings of end cap of the LED tube lamp according to the second embodiment of the present invention which are arranged to form a partial circle.
Figure 17:
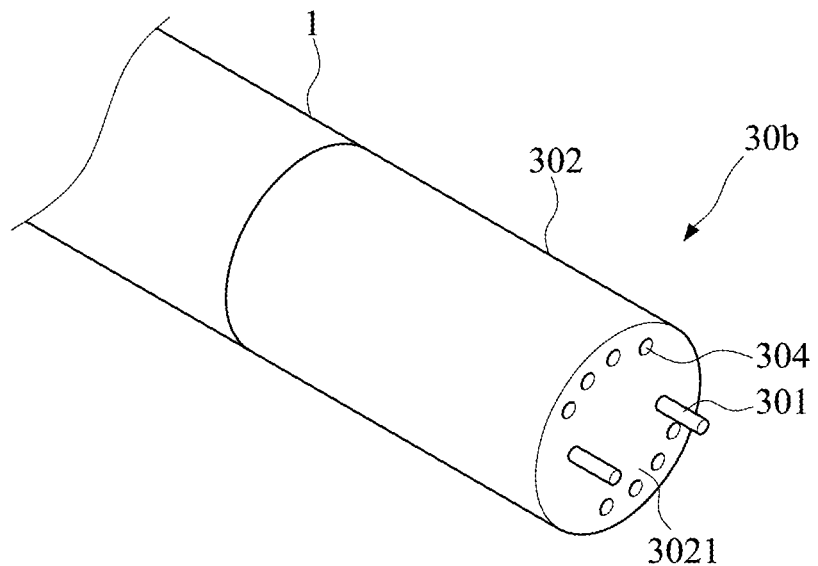
FIG. 17 is a perspective view schematically illustrating the openings of end cap of the LED tube lamp according to the second embodiment of the present invention which are arranged to form two partial circles.
Figure 18:
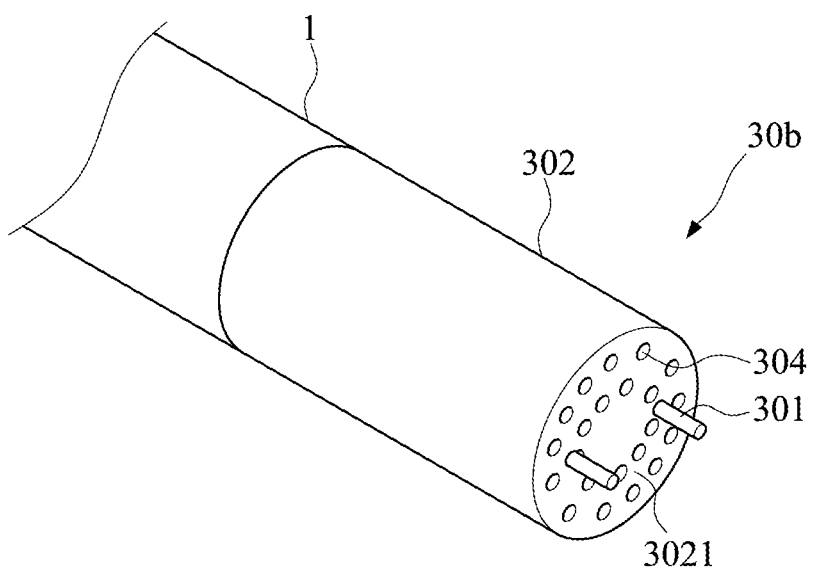
FIG. 18 is a perspective view schematically illustrating the openings of end cap of the LED tube lamp according to the second embodiment of the present invention which are arranged to form a concentric circle.
Figure 19:
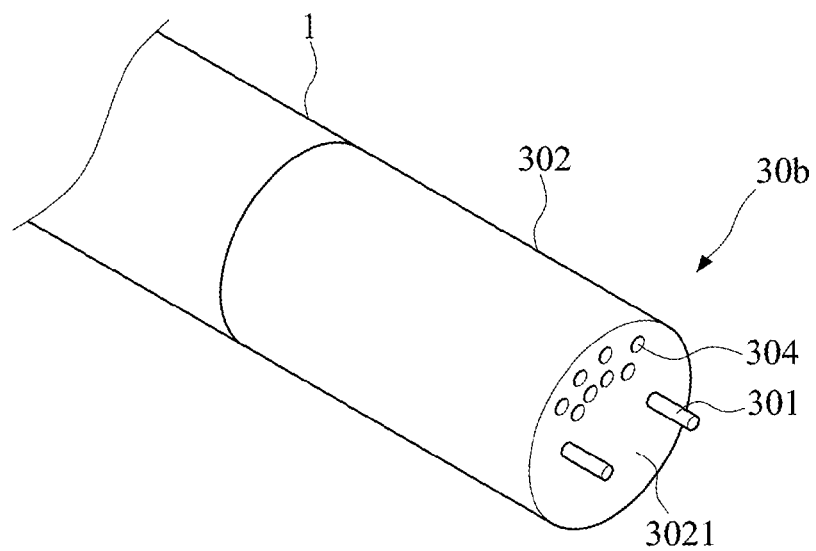
FIG. 19 is a perspective view schematically illustrating the openings of end cap of the LED tube lamp according to the second embodiment of the present invention which are arranged to form concentric partial circles.
Figure 20:
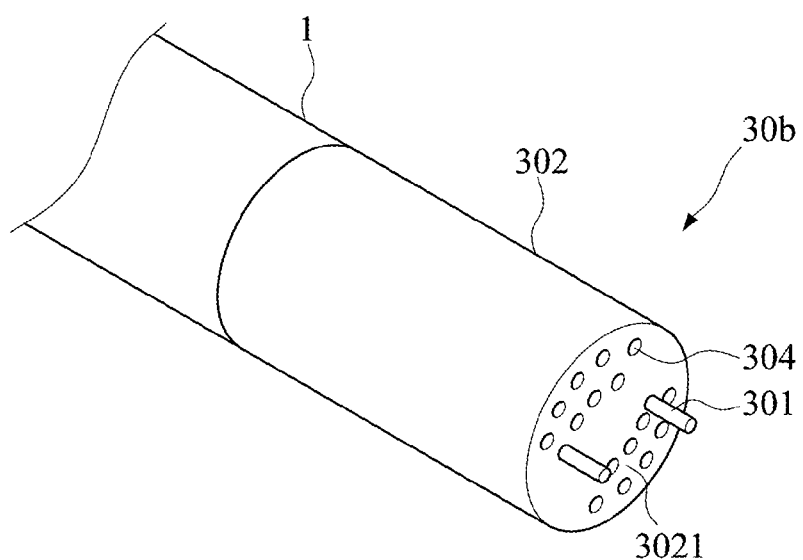
FIG. 20 is a perspective view schematically illustrating the openings of end cap of the LED tube lamp according to the second embodiment of the present invention which are arranged to form concentric partial circles.

Referring to FIG. 15 to FIG. 21, in order to dissipate heat resulting from the power supply 5 and the process of heating of a hot melt adhesive, the larger end cap 30b has openings 304. In some embodiments, the openings 304 may be located on end surface 3021 of the electrically insulating tubular part 302. In some embodiments, the openings 304 may be adjacent to an edge of the end surface 3021 of the electrically insulating tubular part 302. In some embodiments, the openings 304 may be arranged to form a circle as shown in FIG. 15, or a partial circle as shown in FIG. 16 and FIG. 17. In some embodiments, the openings 304 may be arranged to form concentric circles as shown in FIG. 18, or concentric partial circles as shown in FIG. 19 and FIG. 20.

Figure 21:
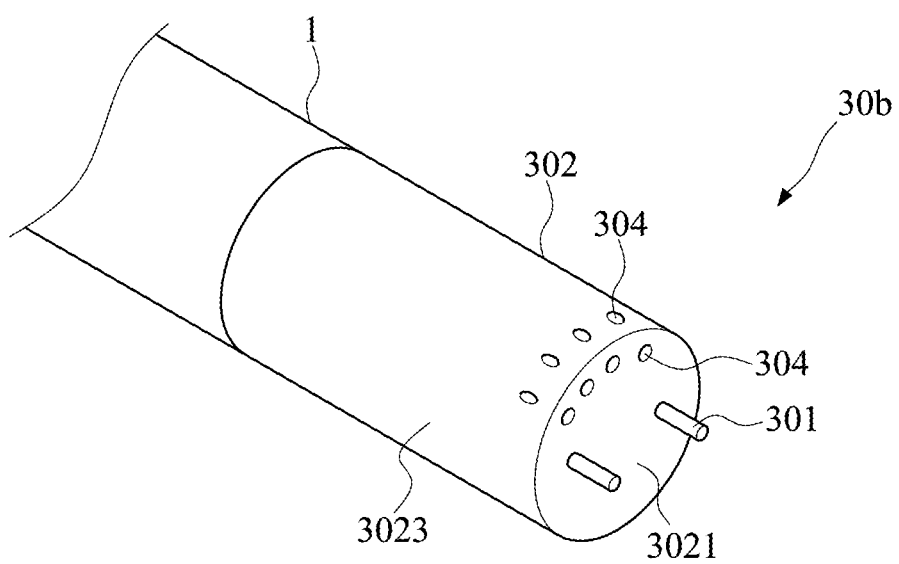
FIG. 21 is a perspective view schematically illustrating at least one opening of the LED tube lamp according to the second embodiment of the present invention is located on an end surface of the electrically insulating tubular part, and at least one opening is located on an outer circumferential surface of the electrically insulating tubular part.

Referring to FIG. 21, in some embodiments, at least one of the openings 304 is located on an end surface 3021 of the electrically insulating tubular part 302, and at least one of the openings 304 is located on an outer circumferential surface 3023 of the electrically insulating tubular part 302.

In the above-mentioned first and second embodiments, by applying electromagnetic field to the magnetic metal member 9, an electrical current will be induced in the magnetic metal member 9, which makes the magnetic metal member 9 be heated. The heated magnetic metal member 9 heats the hot melt adhesive to make the hot melt adhesive expansive and flowing and then solidified after cooling, and the bonding for the end cap 3 and the glass lamp tube 1 can be accomplished. In addition, the hot melt adhesive may be used to electrically insulate the glass lamp tube 1 and the end caps 3 to further prevent from any possible electrical shock when the glass lamp tube 1 is broken.

Figure 22:
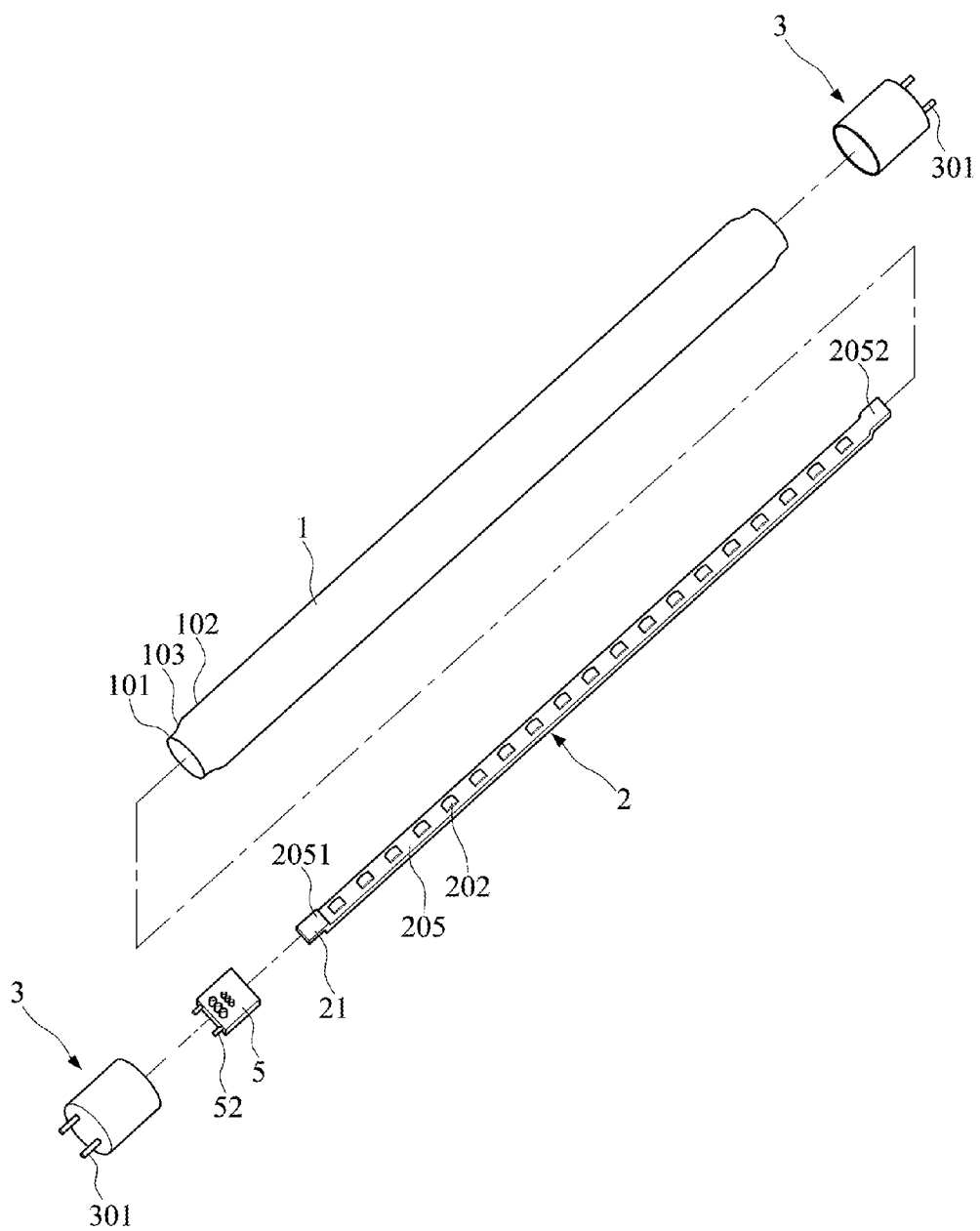
FIG. 22 is an exploded view schematically illustrating the LED tube lamp according to the third embodiment of the present invention.

Referring to FIG. 2 and FIG. 22, an LED tube lamp in accordance with a third embodiment of the present invention includes a glass lamp tube 1, two end caps 3, a power supply 5, and an LED light strip 2. The glass lamp tube 1 extending in a first direction along a length of the glass lamp tube 1 includes a main body region 102, a rear end region 101, and a two-arc-shaped transition region 103 connecting the main body region 102 and the rear end region 101, the main body region 102 and the rear end region 101 are substantially parallel. The two end caps 3 are respectively disposed at two ends of the glass lamp tube 1. The outer diameter of the rear end region 101 is smaller than that of the main body region 102, therefore, a height difference between the rear end region 101 and the main body region 102 is formed to avoid adhesives applied on the rear end region 101 being overflowed onto the main body region 102, and thereby saves manpower for removing the overflowed adhesive and increases productivity.

Figure 23:
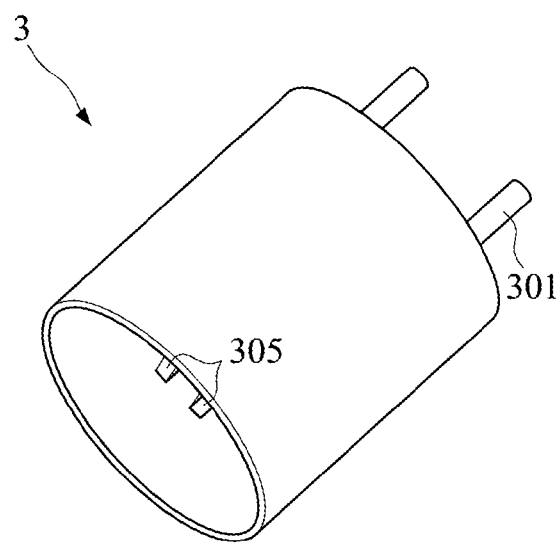
FIG. 23 is a perspective view schematically illustrating the end cap of the LED tube lamp according to the third embodiment of the present invention.
Figure 24:
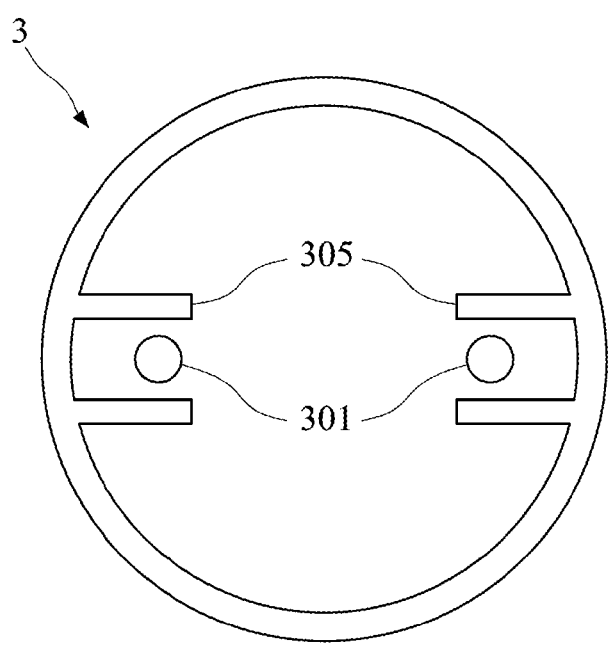
FIG. 24 is a side view schematically illustrating the end cap of the LED tube lamp according to the third embodiment of the present invention.
Figure 25:
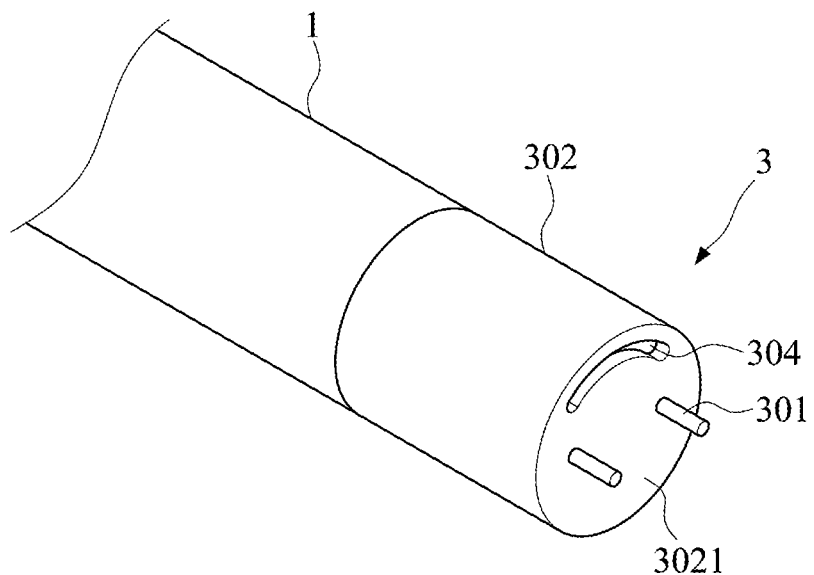
FIGS. 25-30 are perspective views schematically illustrating the openings of end cap of the LED tube lamp according to the third embodiment of the present invention which are in a shape of arc.
Figure 26:
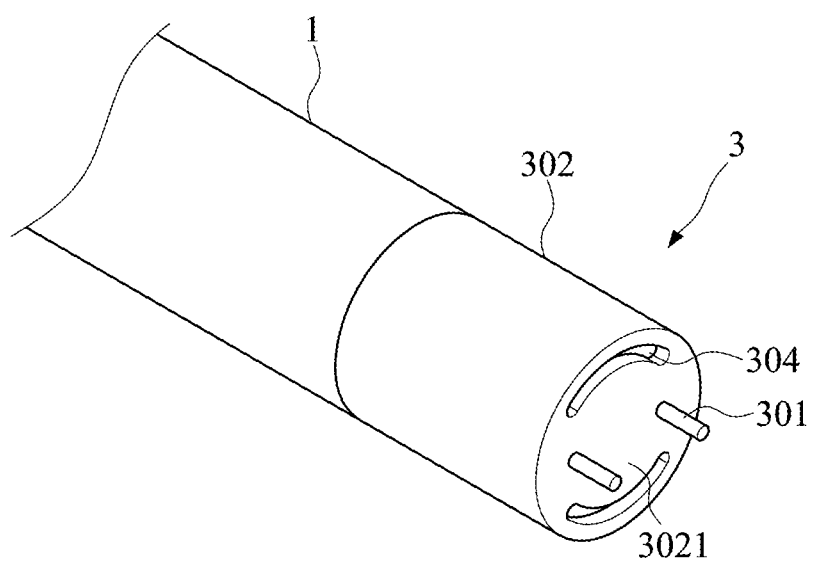
Figure 27:
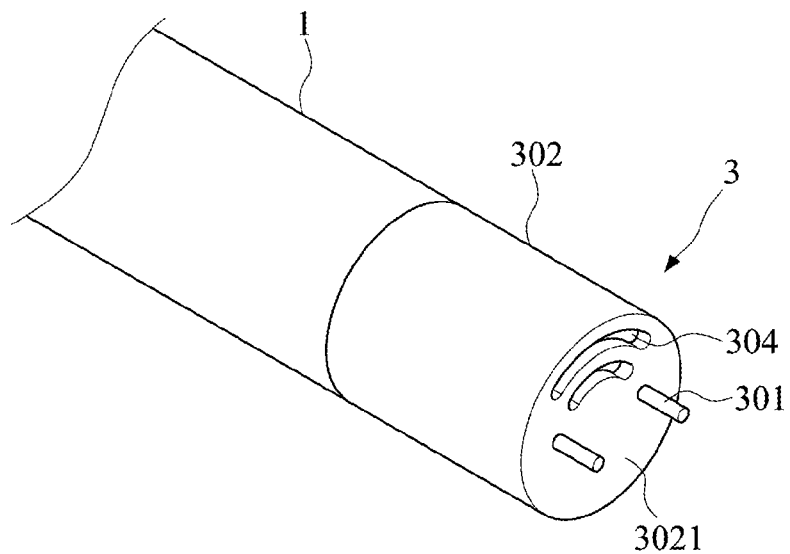
Figure 28:
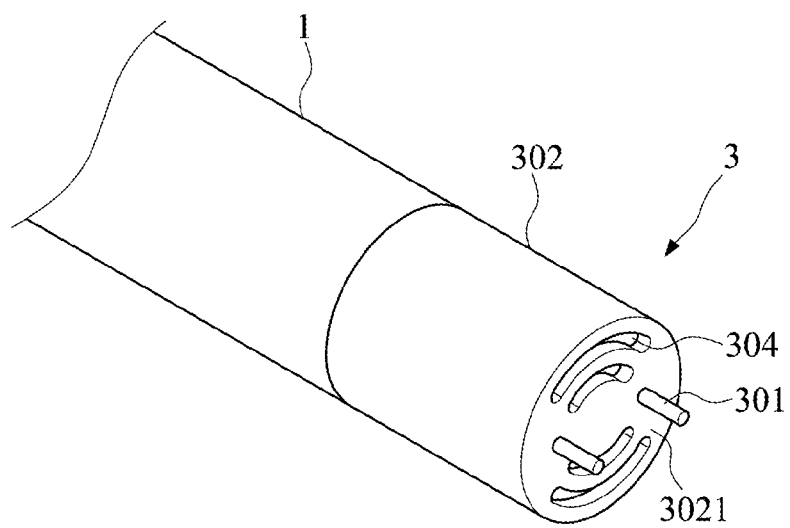
Figure 29:
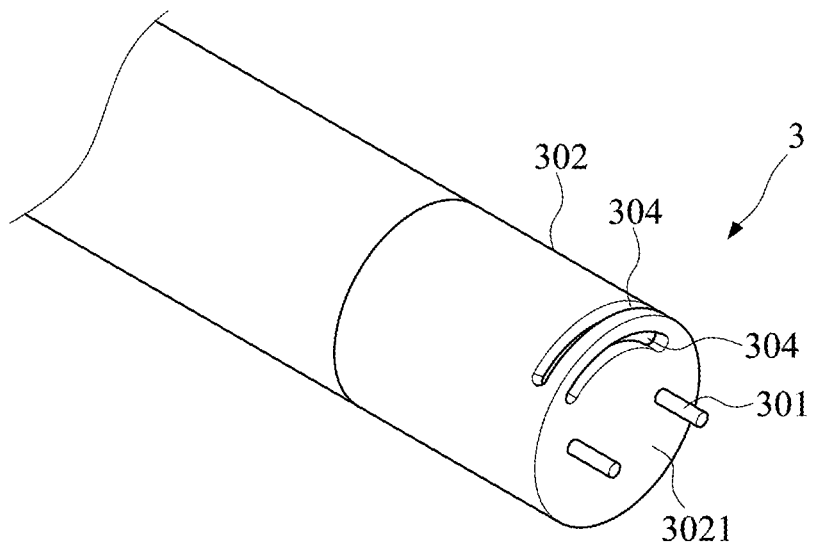
Figure 30:
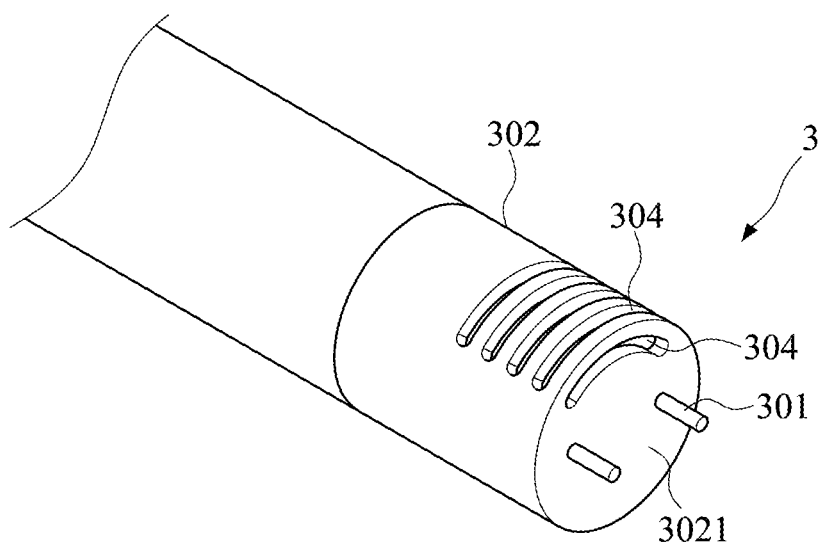

Referring to FIG. 22 to FIG. 24, the end cap 3 in the third embodiment includes a socket 305 for connection with a power supply 5. The glass lamp tube 1 and the end caps 3 are secured by a hot melt adhesive. The power supply 5 is provided inside the end cap 3 and has a metal pin 52 at one end, while the end cap 3 has a hollow conductive pin 301 to accommodate the metal pin 52 of the power supply 5.

Referring to FIG. 6 and FIG. 22, the LED light strip 2 is disposed inside the glass lamp tube 1 with a plurality of LED light sources 202 mounted on the LED light strip 2. The LED light strip 2 has a bendable circuit sheet 205 electrically connecting the LED light sources 202 and the power supply 5. The length of the bendable circuit sheet 205 is larger than the length of the glass lamp tube 1, and the bendable circuit sheet 205 has a first end 2051 and a second end 2052 opposite to each other along the first direction, and at least the first end 2051 of the bendable circuit sheet 205 is bent away from the glass lamp tube 1 to form a freely extending end portion 21 along a longitudinal direction of the glass lamp tube 1. In some embodiments, if two power supplies 5 are adopted, then the second end 2052 might be bent away from the glass lamp tube 1 to form another freely extending end portion 21 along the longitudinal direction of the glass lamp tube 1. The freely extending end portion 21 is electrically connected to the power supply 5. Specifically, the power supply 5 has soldering pads "a" which are capable of being soldered with the soldering pads "b" of the freely extending end portion 21 by soldering material "g".

Figure 31:
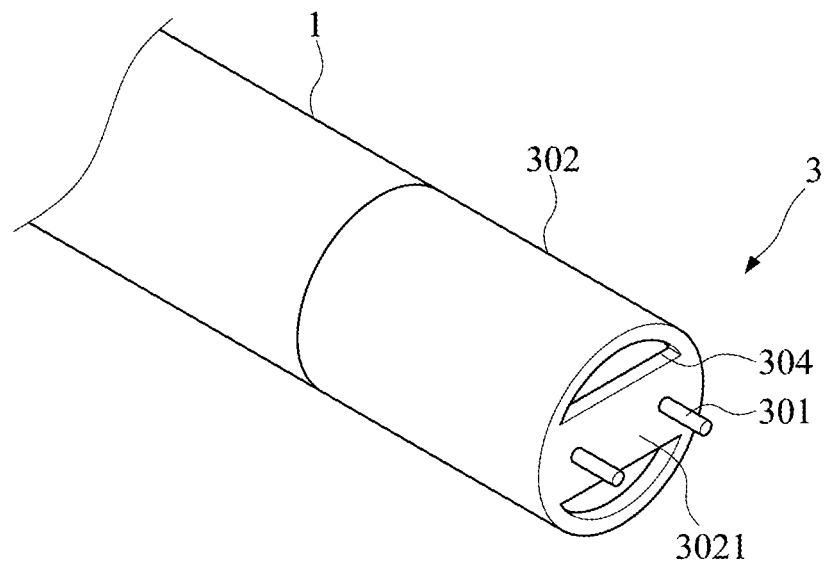
FIG. 31 is a perspective view schematically illustrating the openings of end cap of the LED tube lamp according to the third embodiment of the present invention which are in a shape of partial circle.
Figure 32:
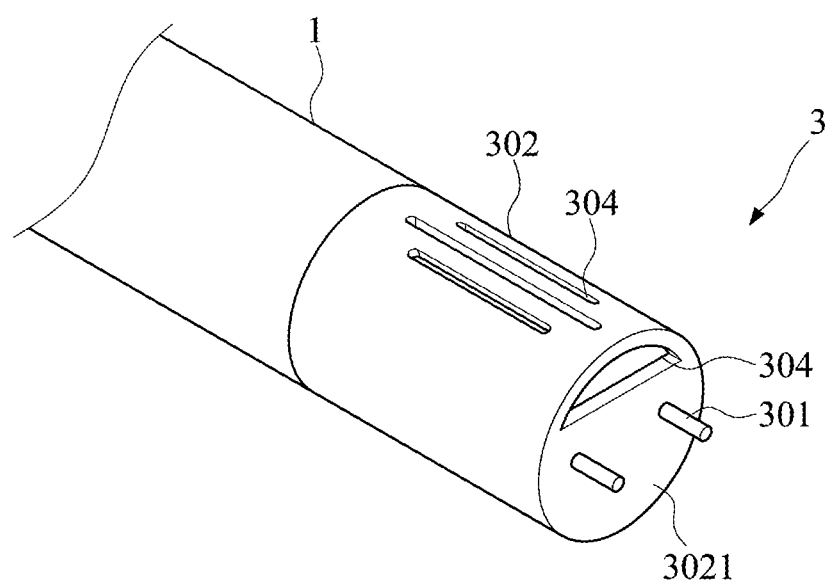
FIG. 32 is a perspective view schematically illustrating openings of the LED tube lamp according to the third embodiment of the present invention on the outer circumferential surface of the electrically insulating tubular part may be in a shape of line, and opening(s) on the end surface of the electrically insulating tubular part is in a shape of partial circle.

In the above-mentioned embodiments, the shape of opening 304 is not limited to be a circle. The openings 304 can be designed to be in a shape of arc as shown in FIG. 25 to FIG. 30, or in a shape of partial circle as shown in FIG. 31, such that the efficiency of heat dissipation of the LED tube lamp could be improved. In some embodiments, as shown in FIG. 32, the openings 304 on the outer circumferential surface 3023 of the electrically insulating tubular part 302 may be in a shape of line, such that the efficiency of heat dissipation of the LED tube lamp could be improved, and the opening 304 on the end surface 3021 of the electrically insulating tubular part 302 is in a shape of partial circle.

In the above-mentioned embodiments, the glass lamp tube 1 extending in a first direction along a length of the glass lamp tube 1 includes the main body region 102, the rear end region 101, and the two-arc-shaped transition region 103 connecting the main body region 102 and the rear end region 101, the main body region 102 and the rear end region 101 are substantially parallel. Therefore, a height difference between the rear end region 101 and the main body region 102 is formed to avoid adhesives applied on the rear end region 101 being overflowed onto the main body region 102, and thereby saves manpower for removing the overflowed adhesive and increases productivity. Since the glass lamp tube 1 includes the two-arc-shaped transition region 103, the bendable circuit sheet 205 is necessary such that it can be mounted on the inner surface of the glass lamp tube 1 as well as extending into the end cap 3 to be connected to the power supply 5. In addition, by disposing openings 304 on the surface of the end cap 3 by passing through the end cap 3 are capable of helping for dissipating heat resulting from the power supply 5 and the process of heating of a hot melt adhesive, such that the reliability of the LED tube lamp could be improved. While in some embodiments, the openings 304 disposed on the surface of the end cap 3 may not pass through the end cap 3 for heat dissipation.

In the above-mentioned embodiments, the hot melt adhesive is a composite including a so-called "welding mud powder". Therefore, each of the end caps 3 and the glass lamp tube 1 can be adhered closely by using the hot melt adhesive to accomplish automatic manufacture for the LED tube lamps. In one embodiment, the volume of the hot melt adhesive may expand to 1.3 times the original size when heated from room temperature to 200 or 250 Degrees Celsius. The hot melt adhesive is not limited to the materials recited herein. Alternatively, a material for the hot melt adhesive to be solidified immediately when heated to a predetermined temperature can be used. The hot melt adhesive provided in each embodiments of the present invention is durable with respect to high temperature inside the end caps 3 due to the heat resulting from the power supply. Therefore, the glass lamp tube 1 and the end caps 3 could be secured to each other without decreasing the reliability of the LED tube lamp.

The above-mentioned features of the present invention can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:
1. An LED tube lamp, comprising:
a glass lamp tube extending in a first direction along a length of the glass lamp tube comprising a main body region, a rear end region, and a two-arc-shaped transition region connecting the main body region and the rear end region, the main body region and the rear end region are substantially parallel;
an end cap disposed at one end of the glass lamp tube, wherein the end cap comprises an electrically insulating tubular part sleeved with the end of the glass lamp tube having an inner circumferential surface with a plurality of protruding portions formed thereon and extending inwardly in a radial direction of the electrically insulating tubular part, a socket for connection with a power supply, at least one opening on surface to dissipate heat, and a magnetic metal member fixedly disposed between the protruding portions of the inner circumferential surface of the electrically insulating tubular part of the end cap and the end of the glass lamp tube, wherein each of the protruding portions is disposed between an outer circumferential surface of the magnetic metal member and the inner circumferential surface of the electrically insulating tubular part thereby forming a space therebetween with a hot melt adhesive contained in the space, and the glass lamp tube and the end cap are secured by the hot melt adhesive;
a power supply provided inside the end cap having a metal pin at one end, while the end cap having a hollow conductive pin to accommodate the metal pin of the power supply; and an LED light strip disposed inside the glass lamp tube with a plurality of LED light sources mounted on the LED light strip;

wherein the LED light strip has a bendable circuit sheet electrically connect the LED light sources and the power supply, and the length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube, and the freely extending end portion is electrically connected to the power supply.

2. The LED tube lamp of claim 1, wherein the at least one opening on surface is to dissipate heat resulting from the power supply.

3. The LED tube lamp of claim 1, wherein the at least one opening on surface is to dissipate heat resulting from the process of heating of a hot melt adhesive.

4. The LED tube lamp of claim 1, wherein the at least one opening on surface is to dissipate heat resulting from the power supply and the process of heating of a hot melt adhesive.

5. The LED tube lamp of claim 1, wherein the at least one opening is located on an end surface of the electrically insulating tubular part.

6. The LED tube lamp of claim 5, wherein the at least one opening is adjacent to an edge of the end surface of the electrically insulating tubular part.

7. The LED tube lamp of claim 5, wherein the at least one opening comprises openings arranged to form a circle or a partial circle.

8. The LED tube lamp of claim 5, wherein the at least one opening comprises openings arranged to form concentric circles or concentric partial circles.

9. The LED tube lamp of claim 1, wherein at least one opening is located on an end surface of the electrically insulating tubular part, and at least one opening is located on an outer circumferential surface of the electrically insulating tubular part.

10. The LED tube lamp of claim 1, wherein the at least one opening is located on an outer circumferential surface of the electrically insulating tubular part.

11. An LED tube lamp, comprising:
a glass lamp tube extending in a first direction along a length of the glass lamp tube comprising a main body region, a rear end region, and a two-arc-shaped transition region connecting the main body region and the rear end region, the main body region and the rear end region are substantially parallel;
two end caps with different sizes respectively disposed at two ends of the glass lamp tube, wherein the end cap comprises an electrically insulating tubular part sleeved with the end of the lamp tube having an inner circumferential surface with a plurality of protruding portions formed thereon and extending inwardly in a radial direction of the electrically insulating tubular part, at least one opening on surface to dissipate heat; and a magnetic metal member, fixedly disposed between the protruding portions of the inner circumferential surface of the electrically insulating tubular part of the end cap and the end of the glass lamp tube, wherein each of the protruding portions is disposed between an outer circumferential surface of the magnetic metal member and the inner circumferential surface of the electrically insulating tubular part thereby forming a space therebetween with a hot melt adhesive contained in the space, and the glass lamp tube and the end cap are secured by the hot melt adhesive;
a power supply provided inside one of the end caps, the power supply has a metal pin at one end, while the end cap has a hollow conductive pin to accommodate the metal pin of the power supply; and
an LED light strip disposed inside the glass lamp tube with a plurality of LED light sources mounted on the LED light strip;
wherein the LED light strip has a bendable circuit sheet electrically connect the LED light sources and the power supply, and the length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube, and the freely extending end portion is electrically connected to the power supply.

12. The LED tube lamp of claim 11, wherein the at least one opening on surface is to dissipate heat resulting from the power supply.

13. The LED tube lamp of claim 11, wherein the at least one opening on surface is to dissipate heat resulting from the process of heating of a hot melt adhesive.

14. The LED tube lamp of claim 11, wherein the at least one opening on surface is to dissipate heat resulting from the power supply and the process of heating of a hot melt adhesive.

15. The LED tube lamp of claim 11, wherein the size of one end cap is 30%-80% of the size of the other end cap.

16. The LED tube lamp of claim 11, wherein the at least one opening is located on an end surface of the electrically insulating tubular part.

17. The LED tube lamp of claim 13, wherein the at least one opening is adjacent to an edge of the end surface of the electrically insulating tubular part.

18. The LED tube lamp of claim 13, wherein the at least one opening comprises openings arranged to form a circle or a partial circle.

19. The LED tube lamp of claim 13, wherein the at least one opening comprises openings arranged to form concentric circles or concentric partial circles.

20. The LED tube lamp of claim 11, wherein at least one opening is located on an end surface of the electrically insulating tubular part, and at least one opening is located on an outer circumferential surface of the electrically insulating tubular part.

21. The LED tube lamp of claim 11, wherein the at least one opening is located on an outer circumferential surface of the electrically insulating tubular part.

22. An LED tube lamp, comprising:
a glass lamp tube extending in a first direction along a length of the glass lamp tube comprising a main body region, a rear end region, and two transition regions connecting the main body region and the rear end region, the main body region and the rear end region are substantially parallel;
two end caps disposed at one end of the glass lamp tube; and
an LED light strip disposed inside the glass lamp tube with a plurality of LED light sources mounted on the LED light strip;
wherein the end cap comprises at least one opening to dissipate heat, the glass lamp tube and the end cap are secured by a hot melt adhesive, and a power supply is provided inside the end cap, the LED light strip has a bendable circuit sheet to electrically connect the LED light sources with the power supply, and a length of the bendable circuit sheet is larger than the length of the glass lamp tube and the bendable circuit sheet has a first end and a second end opposite to each other along the first direction, and at least the first end of the bendable circuit sheet is bent away from the glass lamp tube to form a freely extending end portion along a longitudinal direction of the glass lamp tube, and the freely extending end portion is electrically connected to the power supply.

23. The LED tube lamp of claim 22, wherein the at least one opening is to dissipate heat resulting from the power supply.

24. The LED tube lamp of claim 22, wherein the at least one opening is to dissipate heat resulting from the process of heating of a hot melt adhesive.

25. The LED tube lamp of claim 22, wherein the at least one opening is to dissipate heat resulting from the power supply and the process of heating of a hot melt adhesive.

26. The LED tube lamp of claim 25, wherein the end cap comprises an electrically insulating tubular part, and the at least one opening is located on an end surface of the electrically insulating tubular part.

27. The LED tube lamp of claim 26, wherein the at least one opening comprises openings arranged to form concentric circles or concentric partial circles.

28. The LED tube lamp of claim 22, wherein the at least one opening is in a shape of arc on surface.

* * * * *